United States Patent
Park et al.

(10) Patent No.: US 12,230,329 B2
(45) Date of Patent: Feb. 18, 2025

(54) FLASH MEMORY DEVICE AND DATA RECOVER READ METHOD THEREOF

(71) Applicant: SAMSUNG ELECTRONICS CO., LTD., Suwon-si (KR)

(72) Inventors: Eunhyang Park, Suwon-si (KR); Joonsuc Jang, Suwon-si (KR); Se Hwan Park, Suwon-si (KR); Ji-Sang Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 156 days.

(21) Appl. No.: 17/953,003

(22) Filed: Sep. 26, 2022

(65) Prior Publication Data

US 2023/0142279 A1 May 11, 2023

(30) Foreign Application Priority Data

Nov. 10, 2021 (KR) .................. 10-2021-0154263
May 31, 2022 (KR) .................. 10-2022-0066610

(51) Int. Cl.
*G11C 16/08* (2006.01)
*G11C 16/10* (2006.01)
*G11C 16/28* (2006.01)
*G11C 16/34* (2006.01)

(52) U.S. Cl.
CPC ............ *G11C 16/102* (2013.01); *G11C 16/08* (2013.01); *G11C 16/28* (2013.01); *G11C 16/3404* (2013.01)

(58) Field of Classification Search
CPC . G11C 16/3427; G11C 16/0483; G11C 16/34; G11C 16/3404; G11C 16/3418; G11C 16/28
See application file for complete search history.

(56) References Cited

U.S. PATENT DOCUMENTS

| 7,372,730 | B2 | 5/2008 | Chen |
| 9,349,478 | B2 | 5/2016 | Yuan et al. |
| 9,367,417 | B2 | 6/2016 | Jung et al. |
| 9,805,809 | B1* | 10/2017 | Zhou ................. G11C 16/0483 |
| 10,056,152 | B2 | 8/2018 | Hahn et al. |
| 10,910,068 | B2 | 2/2021 | Takizawa et al. |
| 11,043,274 | B2 | 6/2021 | Choi et al. |
| 11,043,275 | B2 | 6/2021 | Itoh et al. |

(Continued)

FOREIGN PATENT DOCUMENTS

KR  10-2065665  1/2020

*Primary Examiner* — Alfredo Bermudez Lozada
(74) *Attorney, Agent, or Firm* — Fish & Richardson P.C.

(57) ABSTRACT

A flash memory device includes a memory cell array connected with word lines and control logic that performs threshold voltage compensation on the word lines through a data recover read operation. When a word line on which programming is performed after a selected word line is a dummy word line, the control logic performs the threshold voltage compensation on the selected word line based on a result of a data recover read operation of a word line on which programming is performed before the selected word line. When a next word line on which programming is performed after a selected word line is a dummy word line, the control logic performs threshold voltage compensation on the selected word line based on a result of performing the data recover read operation on a previous word line on which programming is performed before the selected word line.

19 Claims, 18 Drawing Sheets

(56) References Cited

U.S. PATENT DOCUMENTS

| | | |
|---|---|---|
| 2005/0162913 A1 | 7/2005 | Chen |
| 2015/0113342 A1 | 4/2015 | Jung et al. |
| 2016/0093390 A1 | 3/2016 | Yuan et al. |
| 2016/0247578 A1* | 8/2016 | Yun .................... G11C 16/3418 |
| 2018/0090216 A1 | 3/2018 | Hahn et al. |
| 2019/0198117 A1* | 6/2019 | Yu ........................ G11C 11/5628 |
| 2019/0279724 A1 | 9/2019 | Itoh et al. |
| 2020/0005878 A1* | 1/2020 | Lu ........................ G11C 11/5642 |
| 2020/0303018 A1 | 9/2020 | Takizawa et al. |
| 2021/0065805 A1 | 3/2021 | Choi et al. |

\* cited by examiner

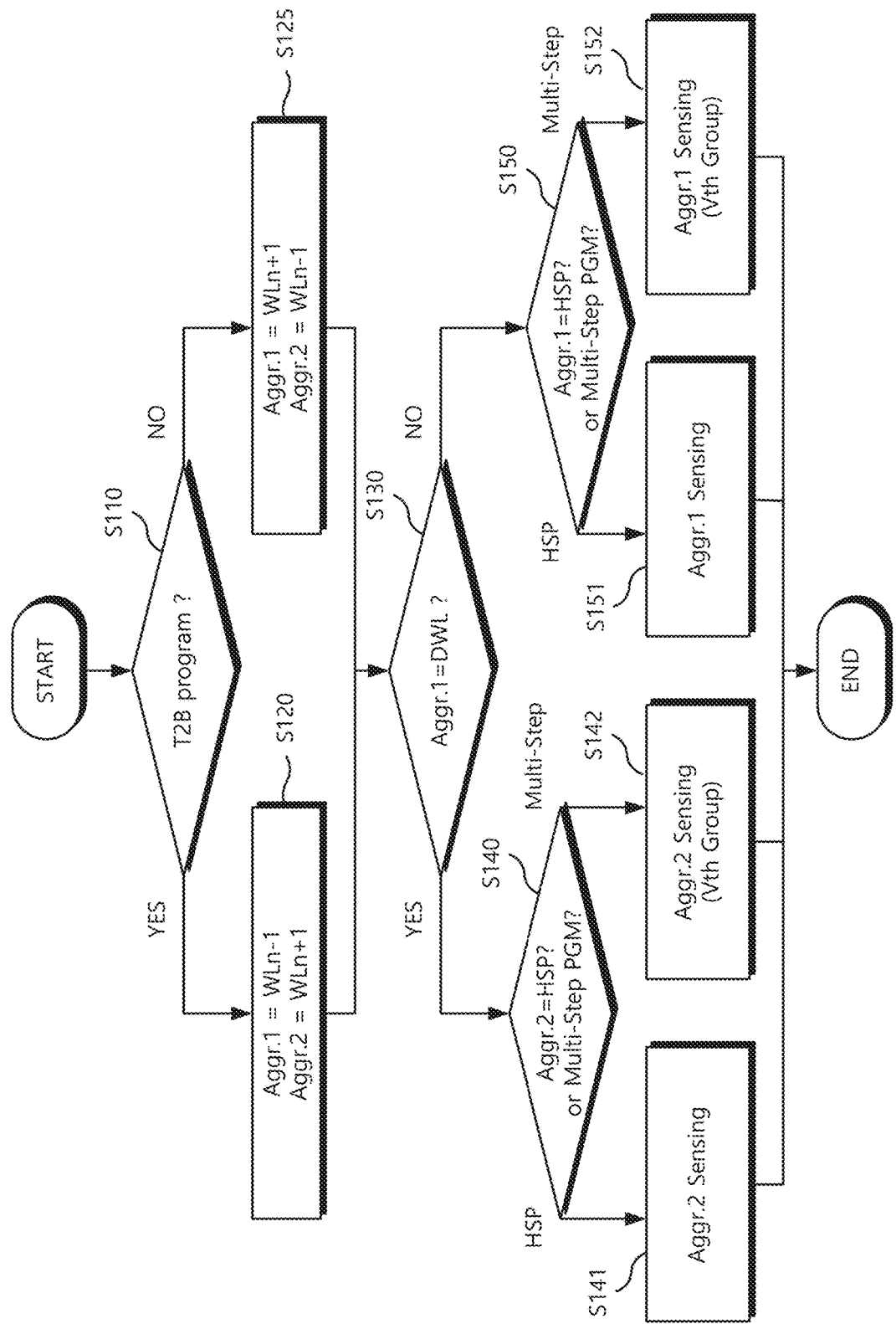

FLASH MEMORY DEVICE AND DATA RECOVER READ METHOD THEREOF

CROSS-REFERENCE TO RELATED APPLICATIONS

This application claims priority under 35 U.S.C. § 119 to Korean Patent Application No. 10-2022-0066610 filed on May 31, 2022, and to Korean Patent Application No. 10-2021-0154263 filed on Nov. 10, 2021, in the Korean Intellectual Property Office, the disclosures of which are incorporated by reference herein in their entireties.

BACKGROUND

Embodiments of the present disclosure described herein relate to a semiconductor memory device and, more particularly, relate to a flash memory device and a data recover read method thereof.

A semiconductor memory device may be classified as a volatile memory device or a non-volatile memory device. The volatile memory device is fast in read and write speeds but loses data stored therein when power is turned off. In contrast, the non-volatile memory device retains data stored therein even when power is turned off. The non-volatile memory device may be used in the case where data should be retained regardless of power.

A flash memory device may be a representative example of the non-volatile memory device. Nowadays, like a vertical NAND flash memory device (VNAND), a technology for stacking memory cells in a three-dimensional structure is being actively developed to improve the degree of integration. In a vertical flash memory device, the number of word line layers stacked in a vertical direction is increasing with each generation. The number of string selection lines formed in the uppermost gate layer is also increasing.

The vertical flash memory device may include a dummy word line or a dummy memory cell that is present at the junction where a first stack (or a lower stack) and a second stack (or an upper stack) meet, and the dummy memory cell may not store data. Even though the vertical flash memory device does not have the multi-stack structure, a word line targeted for a next program operation may be in a state of being not yet programmed depending on the program progress direction. In the case where the next word line is the dummy word line or is in a state of being not programmed, the flash memory device fails to properly perform threshold voltage compensation on a selected word line through a data recover read operation.

SUMMARY

Embodiments of the present disclosure provide a flash memory device capable of properly performing threshold voltage compensation on a selected word line through a data recover read operation even in the case where a next word line is a dummy word line or is in a state of being not programmed, and a data recover read method thereof.

BRIEF DESCRIPTION OF THE DRAWINGS

FIG. 18 is a flowchart illustrating a data recover read method of a flash memory device according to an embodiment of the present disclosure.

DETAILED DESCRIPTION

Below, embodiments of the present disclosure will be described in detail and clearly to such an extent that an ordinary one in the art easily implements them.

I. Data Recovery Read Operation of Flash Memory Device

Figure 1:
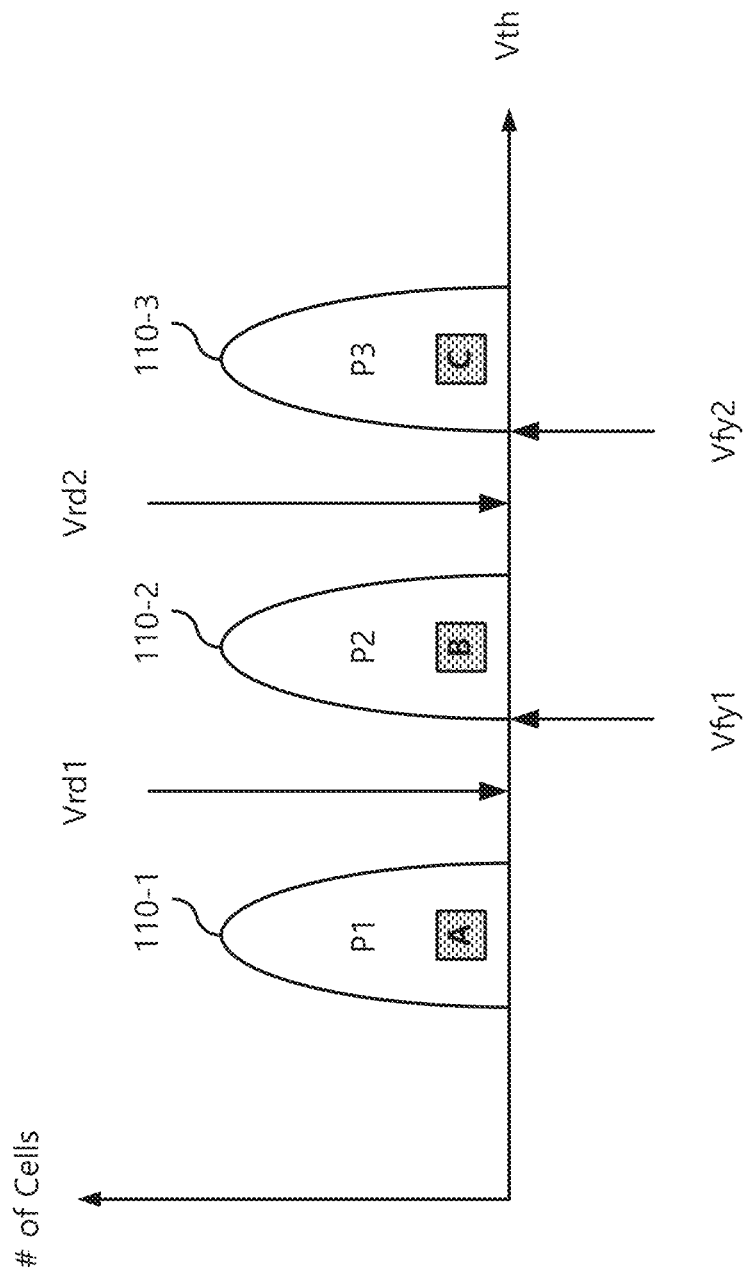
FIG. 1 is a diagram for describing a read method of a flash memory device according to an embodiment of the present disclosure.

FIG. 1 is a diagram for describing a read method of a flash memory device according to an embodiment of the present disclosure. Referring to FIG. 1, a flash memory device may have a plurality of program states. The flash memory device may store data by using threshold voltages Vth of memory cells. In FIG. 1, curves 110-1, 110-2, and 110-3 show threshold voltage distributions after programming.

Data stored in the memory cells may be determined based on a read voltage applied to a word line. A memory cell whose threshold voltage is higher than the read voltage may be distinguished from a memory cell whose threshold voltage is lower than the read voltage. The read operation of the flash memory device may include a normal read operation, a verify read operation, a data recover read operation, a soft decision read operation, a read retry operation, etc.

When a first read voltage Vrd1 or a first verify voltage Vfy1 is applied to the selected word line, a memory cell "A" may be determined as an on-cell, and memory cells "B" and "C" may be determined as an off-cell. When a second read voltage Vrd2 or a second verify voltage Vfy2 is applied to the selected word line, the memory cells "A" and "B" may be determined as an on-cell, and the memory cell "C" may be determined as an off-cell. The memory cell "B" may be determined by using two read voltages Vrd1 and Vrd2. The reason is that the memory cell "B" is determined as an off-cell based on the first read voltage Vrd1 and is determined as an on-cell based on the second read voltage Vrd2.

Figure 2:
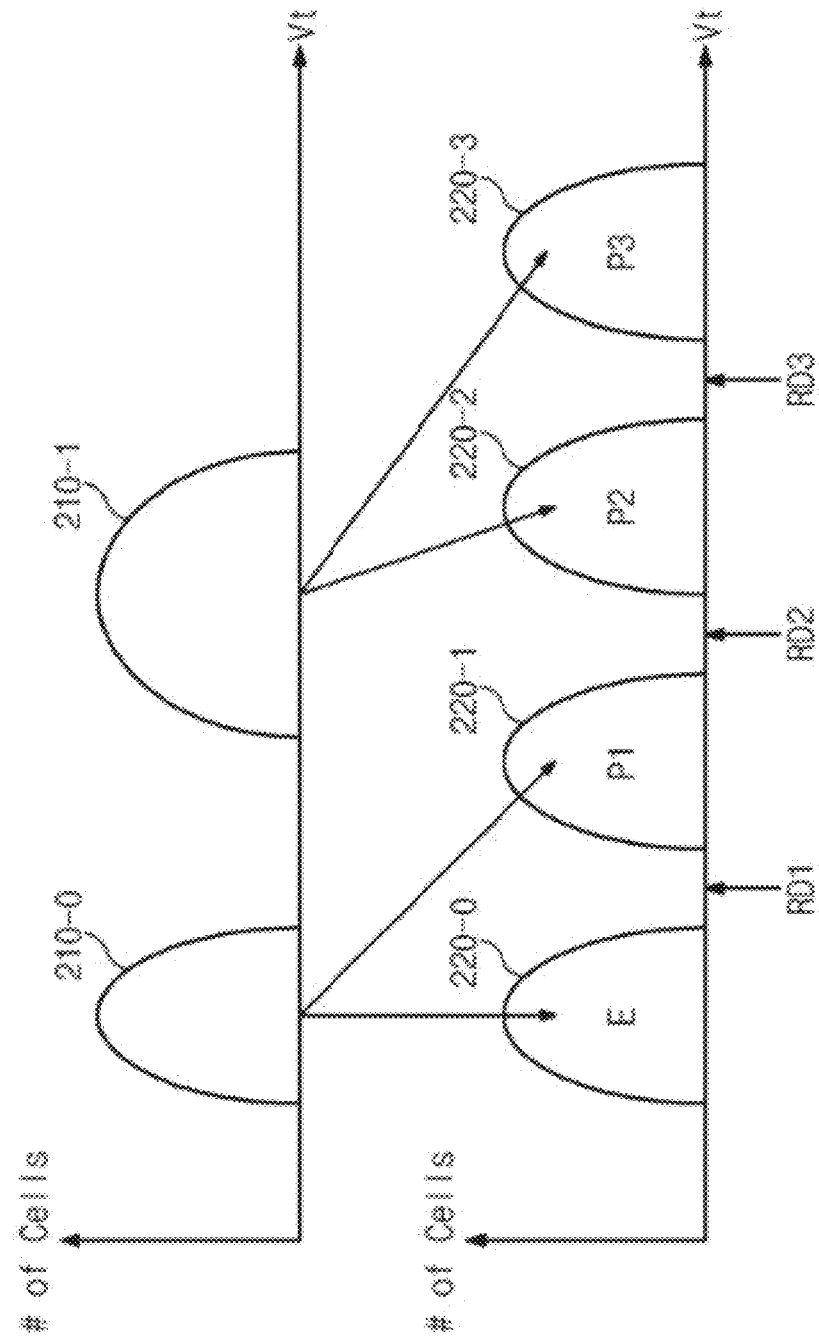
FIG. 2 is a diagram for describing a program method for reducing word line coupling of a flash memory device.

FIG. 2 is a diagram for describing a program method for reducing word line coupling of a flash memory device. A program method for storing 2-bit data per cell and reducing word line coupling is illustrated in FIG. 2. In FIG. 2, curves 210-0 and 210-1 show threshold voltage distributions of memory cells after a lower page program procedure, and curves 220-0, 220-1, 220-2, and 220-3 show threshold voltage distributions of the memory cells after an upper page program procedure.

After the lower and upper pages are programmed, as illustrated in FIG. 2, each of the memory cells may have one of four program states "E", P1, P2, and P3. According to the method illustrated in FIG. 2, memory cells that belong to the threshold voltage distribution 210-0 after the lower page is programmed may be programmed to form the threshold voltage distribution 220-0 or the threshold voltage distribution 220-1. Memory cells that belong to the threshold voltage distribution 210-1 after the lower page is programmed may be programmed to form the threshold voltage distribution 220-2 or the threshold voltage distribution 220-3. The threshold voltage distributions 220-0, 220-1, 220-2, and 220-3 may be determined by using read voltages RD1, RD2, and RD3.

When M-bit data (M being an integer of 2 or more) are stored in each memory cell, threshold voltages of memory cells of an n-th word line may be shifted when an upper page is programmed at memory cells of an (n+1)-th word line. That is, threshold voltage distributions of the memory cells of the n-th word line may widen due to the word line coupling, compared to threshold voltage distributions before the upper page is programmed at the memory cells of the (n+1)-th word line. In other words, because not all the memory cells of the n-th word line but some of the memory cells of the n-th word line selectively suffer from (or experience) the word line coupling when the upper page is programmed at the memory cells of the (n+1)-th word line, a threshold voltage distribution widens.

A memory cell, which has a coupling influence on a memory cell of the n-th word line, from among the memory cells of the (n+1)-th word line is referred to as an "aggressor cell". The (n+1)-th word line connected with the aggressor cell is referred to as an "aggressor word line". Aggressor cells may constitute one or more aggressor cell groups depending on the degree (or magnitude) of coupling that memory cells of the n-th word line experience or depending on a way to program. Memory cells, which do not have a coupling influence on memory cells of the n-th word lines, from among the memory cells of the (n+1)-th word line may also constitute one group.

The remaining memory cells of the (n+1)-th word line other than the aggressor cells may be defined as non-aggressor cells. Each of the aggressor cells and the non-aggressor cells may have one of the program states described with reference to FIG. 2. According to the above definition, the memory cells of the n-th word line may be classified into memory cells experiencing the coupling and memory cells not experiencing the coupling. For this reason, a threshold voltage distribution may widen. A program operation for the (n+1)-th aggressor word line that provides the word line coupling to the memory cells of the n-th word line may be variably determined depending on an address scramble manner.

Figure 3:
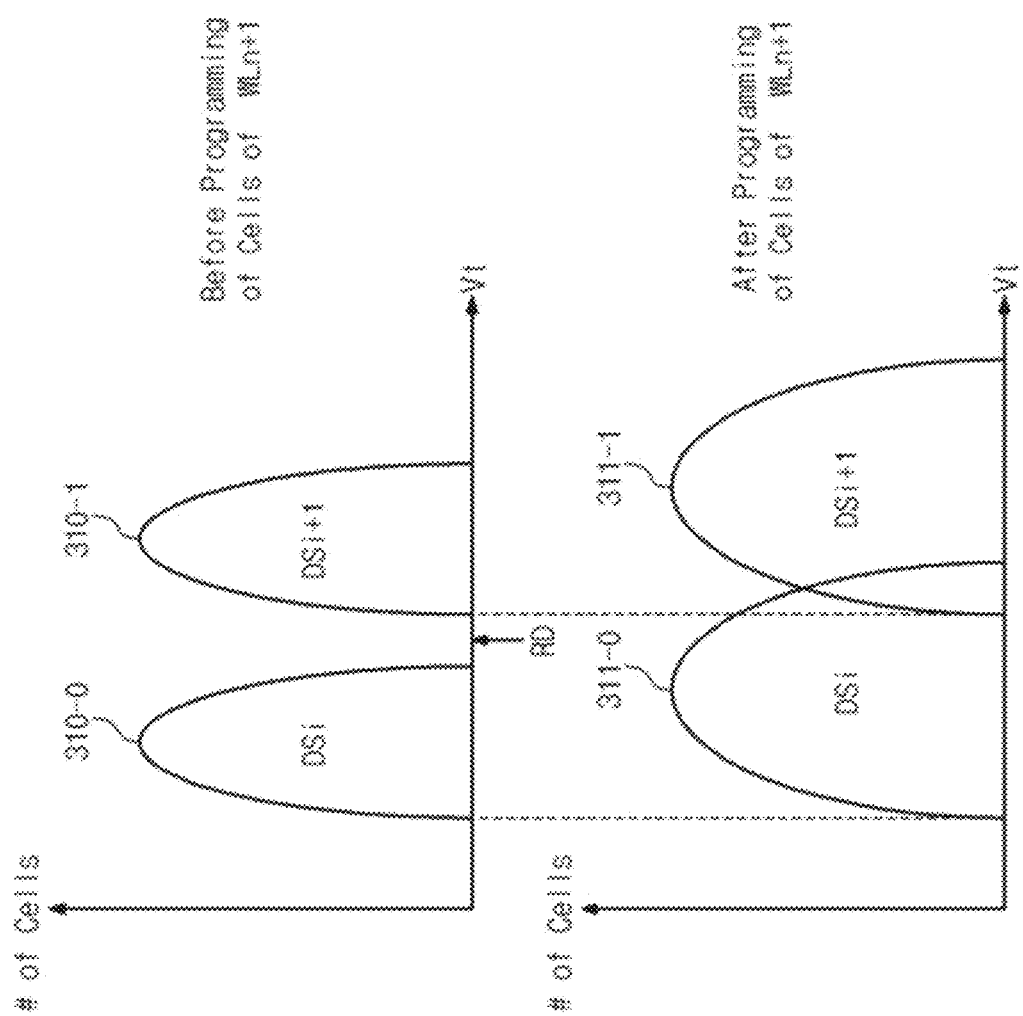
FIG. 3 is a diagram illustrating threshold voltage distributions associated with memory cells of an n-th word line before and after word line coupling caused when memory cells of an (n+1)-th word line are programmed.

FIG. 3 is a diagram illustrating threshold voltage distributions associated with memory cells of an n-th word line before and after word line coupling caused when memory cells of an (n+1)-th word line are programmed. In an example illustrated in FIG. 3, there are illustrated two adjacent threshold voltage distributions DSi 310-0 and DS(i+1) 310-1 associated with the memory cells of the n-th word line before the memory cells of the (n+1)-th word line are programmed, that is, before the word line coupling.

Threshold voltage distributions DSi 311-0 and DS(i+1) 311-1 illustrated in FIG. 3 show threshold voltage distributions associated with the memory cells of the n-th word line after the memory cells of the n-th word line experience the threshold voltage shift corresponding to the word line coupling caused when the memory cells of the (n+1)-th word line are programmed. The threshold voltage distributions 311-0 and 311-1 show all threshold voltage distributions associated with memory cells that experience or do not experience the word line coupling caused when the memory cells of the (n+1)-th word line are programmed.

Figure 4:
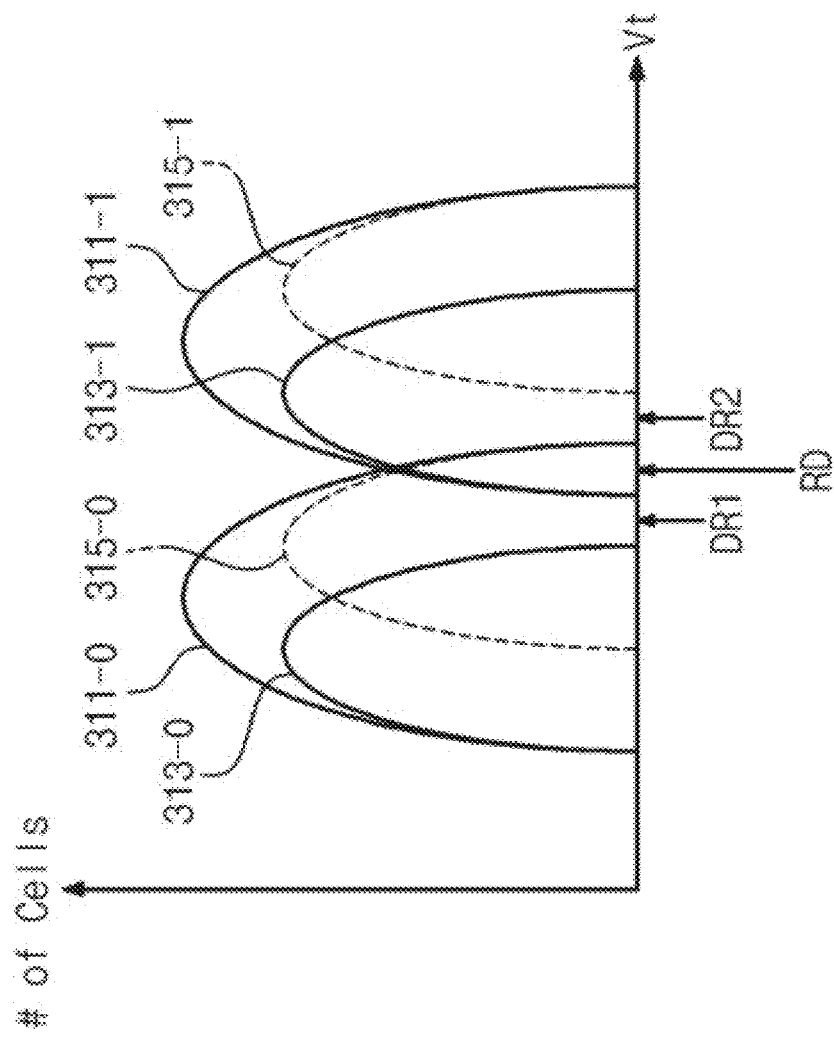
FIG. 4 is a diagram illustrating all threshold voltage distributions of FIG. 3 including memory cells experiencing the coupling and memory cells not experiencing the coupling.

FIG. 4 is a diagram illustrating all threshold voltage distributions of FIG. 3 including memory cells experiencing the coupling and memory cells not experiencing the coupling. In an example of FIG. 4, threshold voltage distributions 313-0 and 313-1 show threshold voltage distributions of memory cells that do not experience the threshold voltage shift due to the word line coupling (or do not experience the word line coupling). Threshold voltage distributions 315-0 and 315-1 show threshold voltage distributions of memory cells that experience the threshold voltage shift due to the word line coupling (or experience the word line coupling). That is, the threshold voltage distributions 315-0 and 315-1 show the threshold voltage shift of memory cells that are previously programmed to have the program states 313-0 and 313-1. The threshold voltage distributions 311-0 and 311-1 may be determined using the read voltage RD.

Programmed memory cells of the n-th word line may belong to the threshold voltage distributions 313-0 and 313-1 of memory cells not experiencing the coupling influence or the threshold voltage distributions 315-0 and 315-1 of memory cells experiencing the coupling influence, depending on the threshold voltage shift caused by the programming of the memory cells of the (n+1)-th word line. A first read voltage DR1 may be used to read memory cells not experiencing the coupling influence, that is, to distinguish memory cells in the threshold voltage distributions 313-0 and 313-1. A second read voltage DR2 may be used to read memory cells experiencing the coupling influence, that is, to distinguish memory cells in the threshold voltage distributions 315-0 and 315-1.

To reduce a read error caused by the word line coupling, two read operations may be performed on one threshold voltage distribution or one program state (composed of a distribution not experiencing the coupling influence and a distribution experiencing the coupling influence) by using the first and second read voltages DR1 and DR2. The number of read operations that are performed on one program state may be determined depending on the number of groups composed of aggressor cells (or program states causing the coupling). For example, aggressor cells may constitute one group or may constitute two or more groups. When aggressor cells constitute one group, two read operations may be performed. When aggressor cells constitute two groups, three read operations may be performed.

Referring to FIG. 4 for describing the read operation that is performed when aggressor cells constitute one group, the read operation using the first read voltage DR1 may be performed to distinguish memory cells belonging to the distributions 313-0 and 313-1 not experiencing the coupling influence. The read operation using the second read voltage DR2 may be performed to distinguish memory cells belonging to the distributions 315-0 and 315-1 experiencing the coupling influence.

The memory cells on which the read operation is performed by using the first read voltage DR1 and the memory cells on which the read operation is performed by using the second read voltage DR2 may be distinguished based on data read from memory cells of an upper word line. According to the above description, the read operation may be first performed on memory cells of an upper word line (or an adjacent word line) of a selected word line before the read operations associated with the memory cells of the selected word line. A set of read operations described above is referred to as a "data recover read operation". The first and second read voltages DR1 and DR2 are respectively referred to as "first and second data recover read voltages".

The data recover read operation may also be applied to a vertical flash memory device, that is, a three-dimensional flash memory device. The vertical flash memory device may include a dummy word line DWL that is not used to store data. When a next word line of a selected word line is the dummy word line DWL, there may be no interference due to programming of the next word line; in this case, even though the data recover read operation is performed, it may be impossible to compensate for the distribution disturbance due to a program pattern(s) of adjacent word lines.

The vertical flash memory device may include the dummy word line DWL that is present at the junction where a first stack (or a lower stack) and a second stack (or an upper stack) meet and is not used to store data. Even though the vertical flash memory device does not have the multi-stack structure, a word line targeted for a next program operation may be in a state of being not yet programmed depending on the program progress direction. Even in the case where a next word line is a dummy word line or a word line on which programming is not performed, the flash memory device according to an embodiment of the present disclosure may compensate for the distribution disturbance due to other deterioration factors by changing an aggressor word line target during the data recover read operation.

II. Three-dimensional Flash Memory Device and Aggressor Word Line Detection

Figure 5:
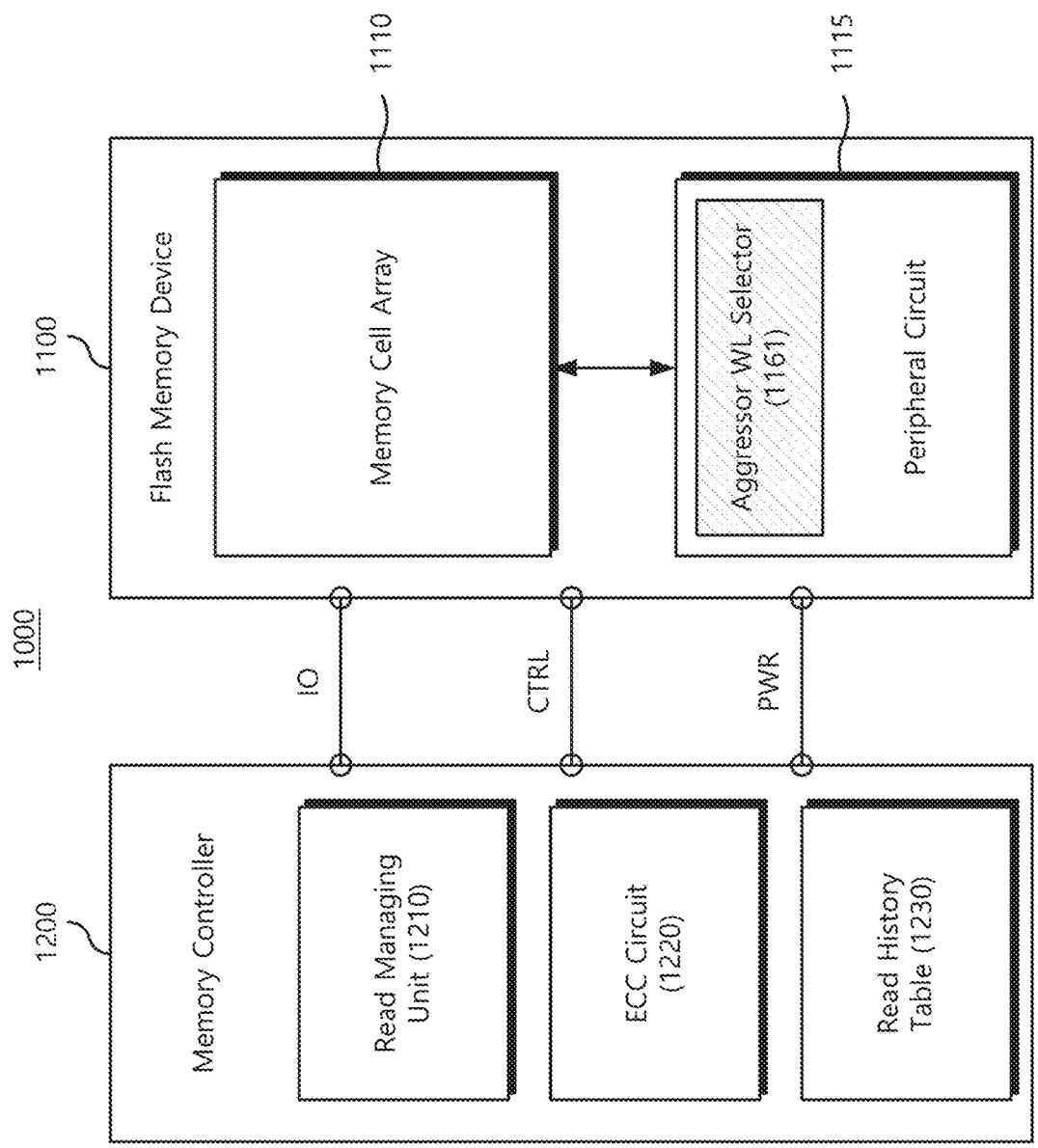
FIG. 5 is a block diagram illustrating a data storage device including a flash memory device according to an embodiment of the present disclosure.

FIG. 5 is a block diagram illustrating a data storage device including a flash memory device according to an embodiment of the present disclosure. Referring to FIG. 5, a data storage device 1000 includes a flash memory device 1100 and a memory controller 1200. The flash memory device 1100 and the memory controller 1200 may be connected through a data input/output line IO, a control line CTRL, and a power line PWR.

Under control of the memory controller 1200, the data storage device 1000 may store data in the flash memory device 1100 or may perform the data recover read operation. The flash memory device 1100 includes a memory cell array 1110 and a peripheral circuit 1115. The peripheral circuit 1115 may include an analog circuit, digital circuits, or the analog and digital circuits, which are necessary to store data in the memory cell array 1110 or to read data from the memory cell array 1110.

The memory cell array 1110 may include a plurality of memory blocks. Each of the memory blocks may have a vertical three-dimensional structure. Each of the memory blocks may include a plurality of memory cells. Multi-bit data may be stored in each of the memory cells. The memory cell array 1110 may be placed next to the peripheral circuit 1115 or on the peripheral circuit 1115 on a design/layout structure. A structure where the memory cell array 1110 is placed on the peripheral circuit 1115 is called a cell on peripheral (COP) structure.

Figure 10:
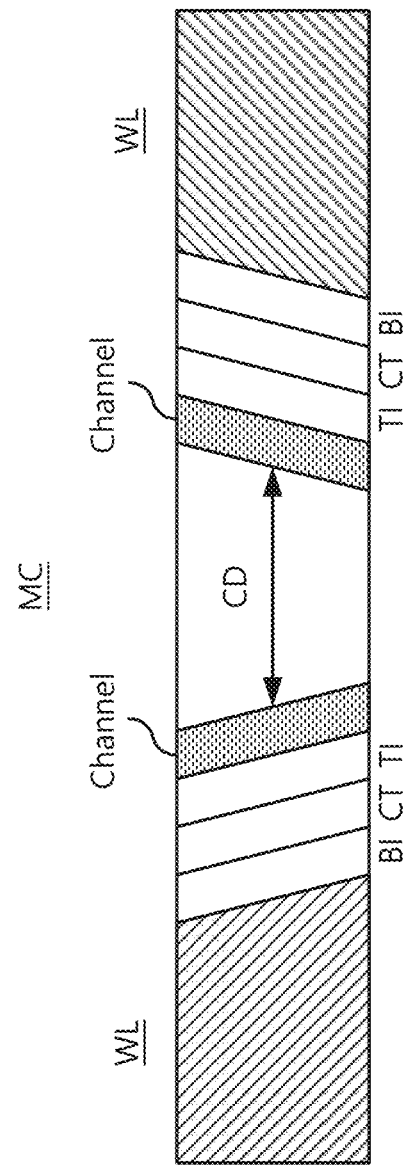
FIG. 10 is a view illustrating a vertical cross-section of one memory cell.

In the COP structure, the memory cell array 1110 may have a pillar structure where a channel diameter CD decreases as it goes toward a substrate (see FIG. 10). Due to a characteristic of the pillar structure of the memory cell array 1110, there is a limitation on stacking memory cells with one stack. For this reason, the flash memory device 1100 may have a multi-stack structure where two or more stacks are piled. Dummy cells that are not used to store data may be present at the junction of the multi-stack structure.

The peripheral circuit 1115 may be supplied with external power PWR from the memory controller 1200 and may generate internal power of various levels. The peripheral circuit 1115 may receive a command, an address, and data from the memory controller 1200 through the data input/output line IO. The peripheral circuit 1115 may store data in the memory cell array 1110 in response to a control signal CTRL. Also, the peripheral circuit 1115 may read data stored in the memory cell array 1110 and may provide the read data to the memory controller 1200.

The peripheral circuit 1115 may include an aggressor word line selector 1161. The aggressor word line selector 1161 may select an aggressor word line depending on whether a word line (hereinafter referred to as a "next word line") located after a selected word line with respect to the program progress direction is a dummy word line or a normal word line.

When the next word line is the normal word line, the aggressor word line selector 1161 may select the next word line as an aggressor word line. However, when the next word line is the dummy word line or is a word line (hereinafter referred to as an "unprogrammed word line") on which programming is not performed, the aggressor word line selector 1161 may select a word line (hereinafter referred to as a "previous word line") located before the selected word line with respect to the program progress direction as an aggressor word line such that a data recover read voltage is applied to the aggressor word line after a sensing operation associated with the selected word line.

That is, the flash memory device 1100 according to an embodiment of the present disclosure may determine whether the next word line is the dummy word line or the unprogrammed word line, may select the next word line or the previous word line as an aggressor word line based on a determination result, and may perform the data recover read operation. It may be possible to compensate for threshold voltages of memory cells connected with the selected word line (hereinafter referred to as "threshold voltages of the selected word line") based on threshold voltages of memory cells connected with the aggressor word line (hereinafter referred to as "threshold voltages of the aggressor word line") through the data recover read operation.

Even though the next word line is determined to be the dummy word line or the unprogrammed word line, the flash memory device 1100 of the present disclosure may select not the next word line but the previous word line as the aggressor word line through the aggressor word line selection operation and may perform the data recover read operation; thus, the flash memory device 1100 may compensate for the distribution disturbance due to the programming of the previous word line.

Continuing to refer to FIG. 5, the memory controller 1200 may include a read managing unit 1210, an error correction code (ECC) circuit 1220, and a read history table 1230. The read managing unit 1210 may manage and adjust read voltages for reading data "DATA" stored in the flash memory device 1100.

For example, when the data "DATA" read from the flash memory device 1100 are uncorrectable by the ECC circuit 1220, the read managing unit 1210 may adjust a plurality of read voltages that are used in the flash memory device 1100. In an embodiment, the read managing unit 1210 may adjust the plurality of read voltages based on the read history table 1230. In an embodiment, the read managing unit 1210 may read the data "DATA" stored in the flash memory device 1100 at least two times or more and may adjust the plurality of read voltages based on the data "DATA" thus read.

The ECC circuit 1220 may detect and correct an error of the data "DATA" read from the flash memory device 1100. For example, the ECC circuit 1220 may generate an error correction code for the data "DATA" to be stored in the flash memory device 1100. The generated error correction code may be stored in the flash memory device 1100 together with the data "DATA".

Afterwards, the ECC circuit 1220 may detect and correct an error of the data "DATA" read from the flash memory device 1100, based on the error correction code thus stored. In an embodiment, the ECC circuit 1220 has a given error correction capability. Data that includes error bits (or fail bits), the number of which exceeds the error correction capability of the ECC circuit 1220, are called "uncorrectable ECC (UECC) data". When the data "DATA" read from the flash memory device 1100 are the UECC data, the read managing unit 1210 may adjust the plurality of read voltages and may again perform the read operation.

The read history table 1230 may store a history of previous read voltages. For example, the read history table 1230 may include information of read voltages read-passed in a previous read operation. The expression "read-passed" indicates that data read by specific read voltages are normal data not including an error or that an error included in the read data is correctable by the ECC circuit 1220.

In an embodiment, the read managing unit 1210 may adjust the plurality of read voltages based on the read history table 1230. That is, because read voltages are adjusted based on previously read-passed read voltages and the data "DATA" are read by using the adjusted read voltages (or read voltage levels), the probability that the error of the read data "DATA" is corrected by the ECC circuit 1220 may increase. That is, the probability of read pass may be improved. This may mean that the performance of the data storage device 1000 is improved.

A previously read-passed read voltage that is stored and managed in the read history table 1230 is referred to as a "history read voltage". The read history table 1230 may include information about history read voltages for each of a plurality of pages included in the flash memory device 1100. For example, the read history table 1230 may include information of previously read-passed read voltages for each word line.

The read managing unit 1210 may update the read history table 1230. For example, the read managing unit 1210 may detect an optimal read voltage. The optimal read voltage indicates read voltages read-passed when data are read. In an embodiment, the read managing unit 1210 may read data from the flash memory device 1100 at least two times or more and may detect the optimal read voltage based on the read data. An operation of detecting the optimal read voltage is also called a valley search operation.

When data read from the flash memory device 1100 are determined to be the UECC data, the data storage device 1000 illustrated in FIG. 5 may perform the valley search operation. The flash memory device 1100 may perform sensing on a selected word line, may detect an aggressor address, and may compensate for threshold voltage information of the selected word line based on a detection result. According to the present disclosure, even when the next word line is the dummy word line or the unprogrammed word line, the probability of ECC pass may become high.

Figure 6:
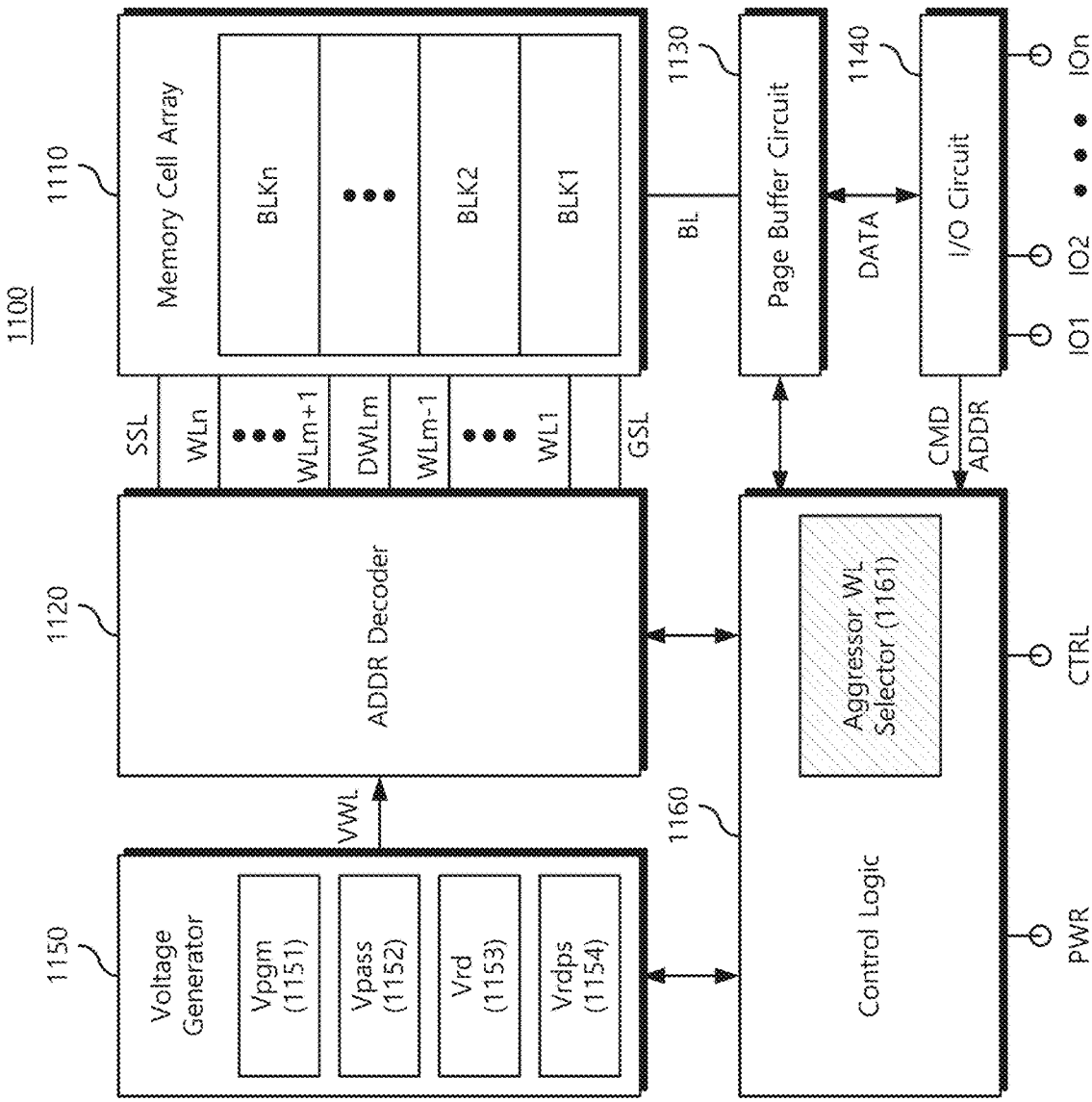
FIG. 6 is a block diagram illustrating a flash memory device illustrated in FIG. 5.

FIG. 6 is a block diagram illustrating a flash memory device illustrated in FIG. 5. Referring to FIG. 6, the flash memory device 1100 may include the memory cell array 1110, an address decoder 1120, a page buffer circuit 1130, a data input/output circuit 1140, a voltage generator 1150, and control logic 1160.

The memory cell array 1110 may include a plurality of memory blocks BLK1 to BLKn. A memory block (e.g., BLK1) may be formed in a direction perpendicular to a substrate. A gate electrode layer and an insulation layer may be alternately deposited on the substrate. The gate electrode layers of the memory block may be connected with a string selection line SSL, a plurality of word lines WL1 to WLm and WLm+1 to WLn, and a ground selection line GSL. In FIG. 6, DWLm may indicate a dummy word line.

The address decoder 1120 may be connected with the memory cell array 1110 through the selection lines SSL and GSL, the word lines WL1 to WLm and WLm+1 to WLn, and the dummy word line DWLm. The address decoder 1120 may select a word line in the program or read operation. The address decoder 1120 may receive a word line voltage VWL from the voltage generator 1150 and may provide the selected word line with the program voltage or the read voltage.

The page buffer circuit 1130 may be connected with the memory cell array 1110 through bit lines BL. The page buffer circuit 1130 may temporarily store data to be programmed in the memory cell array 1110 or data read from the memory cell array 1110. The page buffer circuit 1130 may include a page buffer that is connected with each bit line BL. Each page buffer may include a plurality of latches for the purpose of storing or reading multi-bit data.

The data input/output circuit 1140 may be connected with the page buffer circuit 1130 through data, DATA, lines internally and may be connected with the memory controller 1200 (refer to FIG. 5) through input/output lines IO1 to IOn externally. During the program operation, the data input/output circuit 1140 may receive program data from the memory controller 1200. During the read operation, the data input/output circuit 1140 may provide the memory controller 1200 with data read from the memory cell array 1110.

The voltage generator 1150 may be supplied with internal power from the control logic 1160 and may generate the word line voltage VWL necessary to read or write data. The word line voltage VWL may be provided to a selected word line WLs or an unselected word line WLu through the address decoder 1120.

The voltage generator 1150 may include a program voltage (Vpgm) generator 1151 and a pass voltage (Vpass) generator 1152. The program voltage generator 1151 may generate a program voltage Vpgm that is provided to the selected word line during the program operation. The pass voltage generator 1152 may generate a pass voltage Vpass that is provided to the selected word line WLs and the unselected word line WLu.

The voltage generator 1150 may further include a read voltage (Vrd) generator 1153 and a read pass voltage (Vrdps)

generator 1154. The read voltage generator 1153 may generate a selection read voltage Vrd that is provided to the selected word line WLs during the read operation. The read pass voltage generator 1154 may generate a read pass voltage Vrdps that is provided to the unselected word line WLu. The read pass voltage Vrdps may be a voltage sufficient to turn on memory cells connected with the unselected word line WLu during the read operation.

The control logic 1160 may control the program, read, and erase operations of the flash memory device 1100 by using a command CMD, an address ADDR, and the control signal CTRL provided from the memory controller 1200. The address ADDR may include a block address (or block selection address) for selecting one memory block and a row address and a column address for selecting one memory cell of the selected memory block.

The control logic 1160 may include the aggressor word line selector 1161. The aggressor word line selector 1161 may determine whether the next word line is the dummy word line or the normal word line. When the next word line is the normal word line, the aggressor word line selector 1161 may select the next word line as an aggressor word line. However, when the next word line is the dummy word line, the aggressor word line selector 1161 may determine that the previous word line is the aggressor word line and may perform the data recover read operation based on a result of performing sensing on the previous word line.

Figure 7:
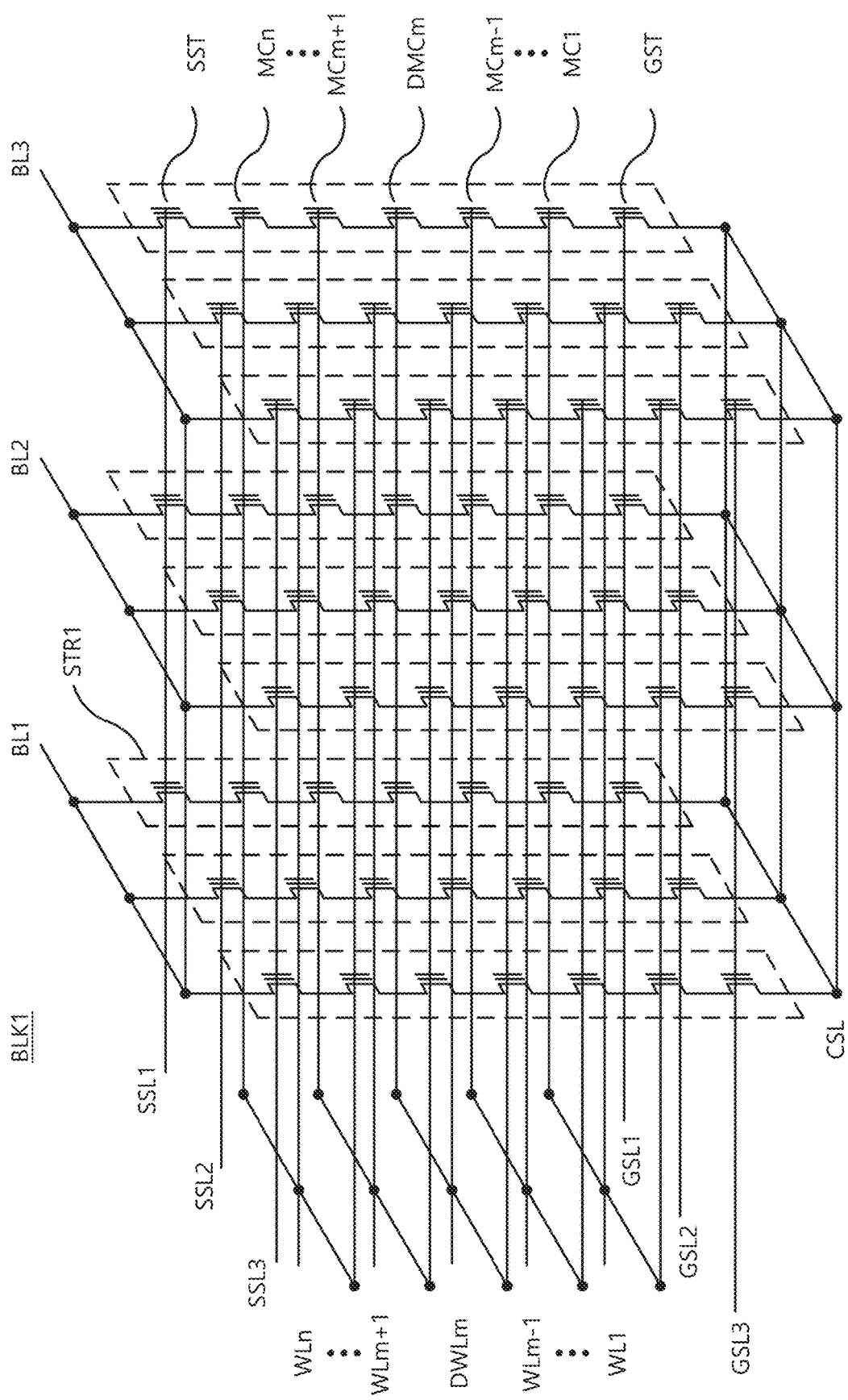
FIG. 7 is a circuit diagram illustrating the memory block of a memory cell array of FIG. 6.

FIG. 7 is a circuit diagram illustrating the memory block BLK1 of a memory cell array of FIG. 6. Referring to FIG. 7, in the memory block BLK1, a plurality of cell strings STR may be formed between bit lines BL1 to BL3 and a common source line CSL. Each cell string STR includes a string selection transistor SST, a plurality of memory cells MC1 to MCm−1 and MCm+1 to MCn, a dummy memory cell DMCm, and a ground selection transistor GST.

The string selection transistors SST may be connected with string selection lines SSL1 to SSL3. The ground selection transistors GST may be connected with ground selection line GSL1 to GSL3. The string selection transistors SST may be connected with the bit lines BL1 to BL3, and the ground selection transistors GST may be connected with the common source line CSL.

The plurality of memory cells MC1 to MCm−1 and MCm+1 to MCn may be connected with the plurality of word lines WL1 to WLm−1 and WLm+1 to WLn. The first word line WL1 may be placed above the ground selection lines GSL1 to GSL3. The first memory cells MC1 that are placed at the same height from the substrate may be connected with the first word line WL1. The (m−1)-th memory cells MCm that are placed at the same height from the substrate may be connected with the (m−1)-th word line WLm−1.

Likewise, the (m+1)-th memory cells MCm+1 may be connected with the (m+1)-th word line WLm+1, and the n-th memory cells MCn may be connected with the n-th word line WLn. The dummy word line DWLm may be interposed between the (m−1)-th word line WLm−1 and the (m+1)-th word line WLm+1. The dummy memory cell DMCm that are placed at the same height from the substrate may be connected with the dummy word line DWLm.

Figure 8:
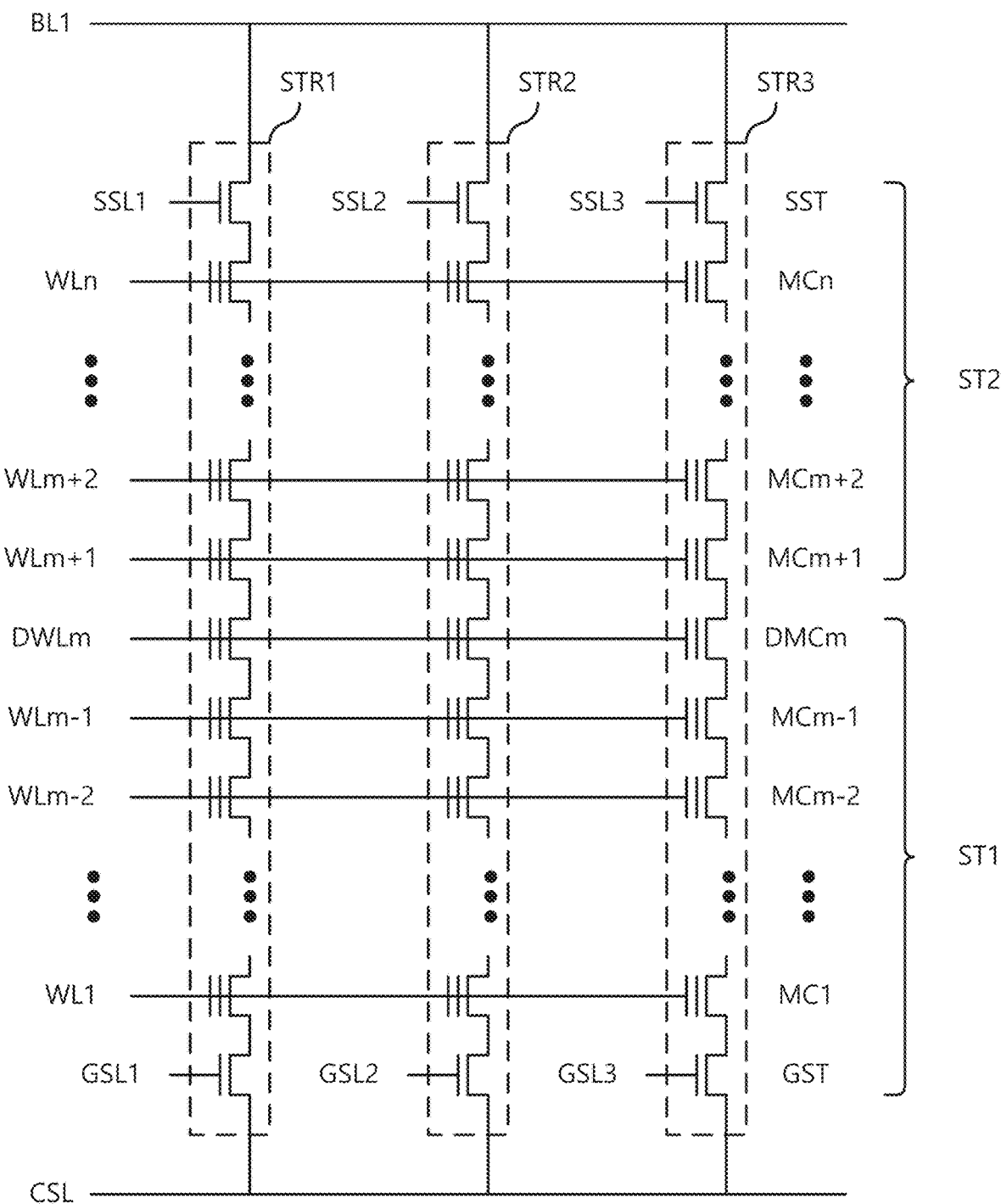
FIG. 8 is a circuit diagram illustrating cell strings connected with the bit line and the common source line of the memory block illustrated in FIG. 7.

FIG. 8 is a circuit diagram illustrating cell strings STR1 to STR3 connected with the bit line BL1 and the common source line CSL of the memory block BLK1 illustrated in FIG. 7. Each of the cell strings STR1 to STR3 includes the string selection transistor SST that is selected by string selection line SSL1, SSL2, or SSL3, the plurality of memory cells MC1 to MCm−1 and MCm+1 to MCn that are controlled by the plurality of word lines WL1 to WLm−1 and WLm+1 to WLn, the dummy memory cell DMCm that is controlled by the dummy word line DWLm, and the ground selection transistor GST that is selected by the ground selection line GSL1, GSL2, or GSL3.

Each of the cell strings STR1 to STR3 may include a first stack ST1 and a second stack ST2 that are separated from each other by (or based on) the dummy word line DWLm. The first stack ST1 may include the memory cells MC1 to MCm connected with the first to m-th word lines WL1 to WLm. Herein, the m-th word line may be a dummy word line, and the m-th memory cell may be a dummy memory cell. The second stack ST2 may include the memory cells MCm+1 to MCn connected with the (m+1)-th to n-th word lines WLm+1 to WLn.

Figure 9:
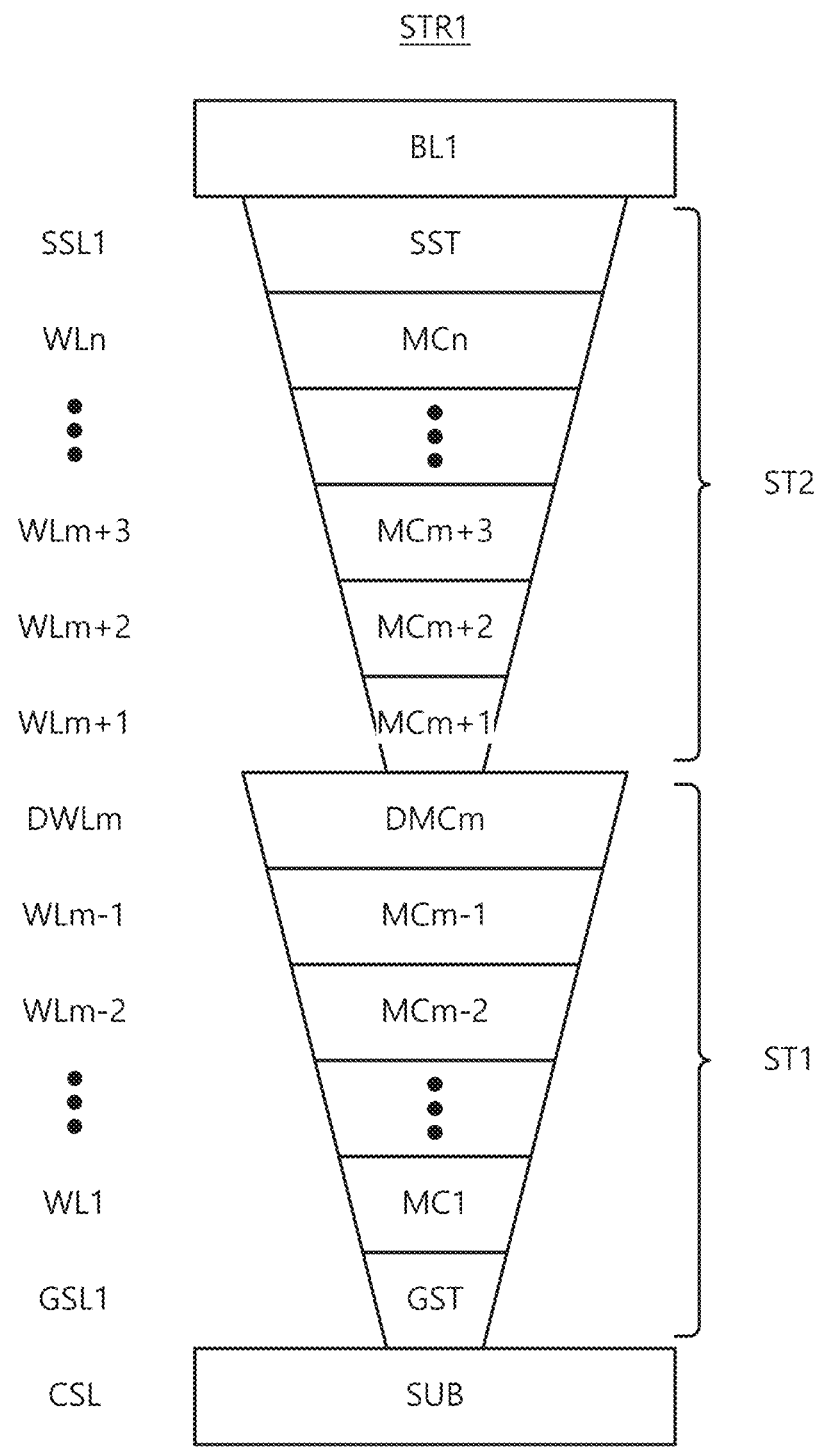
FIG. 9 is a view illustrating a vertical cross-section of the first cell string illustrated in FIG. 8.

FIG. 9 is a view illustrating a vertical cross-section of the first cell string STR1 illustrated in FIG. 8, and FIG. 10 is a view illustrating a vertical cross-section of one memory cell. Referring to FIG. 9, the dummy word line DWLm may be placed at the junction of the first stack ST1 and the second stack ST2. An example where the dummy word line DWLm is included in the first stack ST1 is illustrated in FIG. 9, but the present disclosure is not limited thereto. For example, the dummy word line DWLm may be included in the second stack ST2 or may be included in both the first stack ST1 and the second stack ST2. For example, two dummy word lines DWLm may be present in the first stack ST1, and two dummy word lines DWLm may be present in the second stack ST2.

The first stack ST1 may include the ground selection transistor GST and the first to m-th memory cells MC1 to MCm interposed between the common source line CSL and the m-th word line WLm, and. Herein, the m-th word line may be a dummy word line DWLm, and the m-th memory cell may be a dummy memory cell DMCm. The second stack ST2 may include the memory cells memory cells MCm+1 to MCn connected with the (m+1)-th to n-th word lines WLm+1 to WLn.

Referring to FIG. 10, the memory cell MC may have a cylindrical structure where the channel diameter CD decreases as it goes downwardly. An air gap may be present in the memory cell MC. A channel may be formed of P-type silicon and may form a current path. The memory cell MC may include a cylindrical data storage layer surrounding the channel. The data storage layer may include a tunnel insulation layer TI, a charge trap layer CT, and a blocking insulation layer BI. The word line WL may be formed of a gate electrode layer surrounding the data storage layer.

Figure 11:
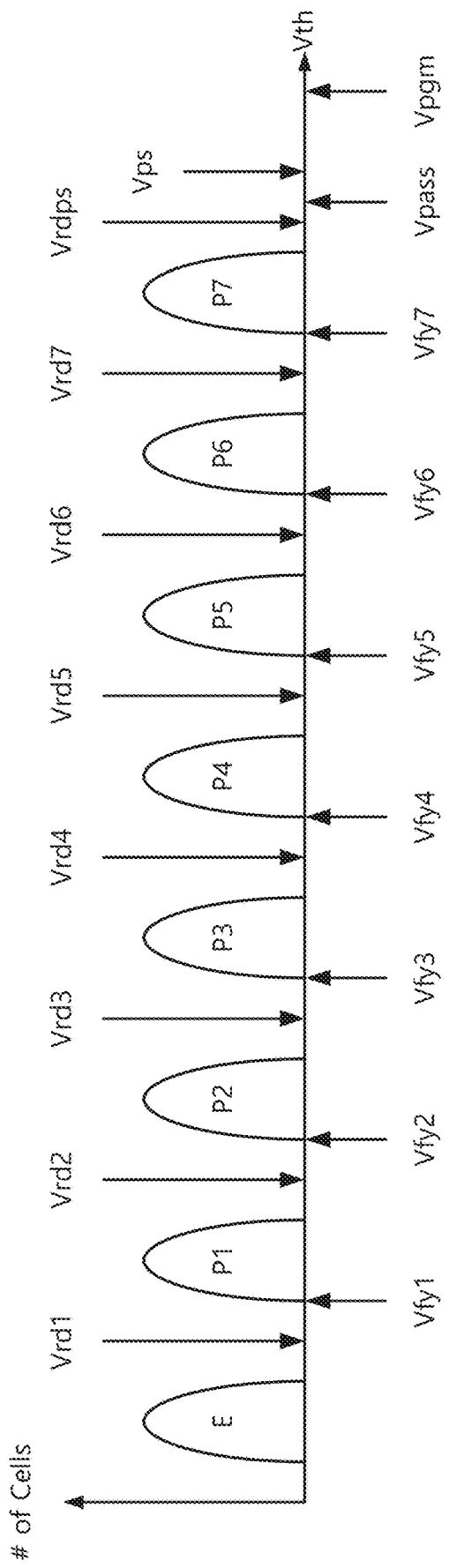
FIG. 11 is a diagram illustrating threshold voltage distributions of flash memory cells.

III. Method for Aggressor Word Line Selection and Threshold Voltage Compensation of Flash Memory Device FIG. 11 is a diagram illustrating threshold voltage distributions of flash memory cells. In FIG. 11, a horizontal axis represents a threshold voltage Vth and a vertical axis represents the number of memory cells. FIG. 11 shows an example in which 3-bit data are stored in one memory cell. A 3-bit memory cell may have one of eight states "E" and P1 to P7 depending on a threshold voltage distribution. Herein, "E" indicates an erase state, and P1 to P7 indicate program states.

In the read operation, the flash memory device 1100 (refer to FIG. 6) may provide the selection read voltages Vrd1 to Vrd7 to the selected word line WLs and may provide the pass voltage Vps or the read pass voltage Vrdps to the unselected word line WLu. The pass voltage Vps or the read pass voltage Vrdps may be a voltage sufficient to turn on a memory cell.

The first selection read voltage Vrd1 has a voltage level between the erase state "E" and the first program state P1; the second selection read voltage Vrd2 has a voltage level between the first and second program states P1 and P2; similarly, the seventh selection read voltage Vrd7 has a voltage level between the sixth and seventh program states P6 and P7.

When the first selection read voltage Vrd1 is applied to the selected word line WLs, a memory cell having the erase state "E" may be determined to be an on-cell, and a memory cell having one of the first to seventh program states P1 to P7 may be determined to be an off-cell. When the second selection read voltage Vrd2 is applied to the selected word line WLs, a memory cell having one of the erase state "E" and the first program state P1 may be determined to be an on-cell, and a memory cell having one of the second to seventh program states P2 to P7 may be determined to be an off-cell. As in the above description, when the seventh selection read voltage Vrd7 is applied to the selected word line WLs, a memory cell having one of the erase state "E" and the first to sixth program states P1 to P6 may be determined to be an on-cell, and a memory cell having the seventh program state P7 may be determined to be an off-cell.

In the program operation, the flash memory device 1100 applies the pass voltage Vpass to all the word lines and then applies the program voltage Vpgm to the selected word line WLs. After applying the program voltage Vpgm, the flash memory device 1100 may provide the program verify voltages Vfy1 to Vfy7 to the memory cell for the purpose of verifying whether the memory cell has a target threshold voltage.

Meanwhile, during the data recover read operation, the flash memory device 1100 may perform the valley search operation for the purpose of finding the optimal read voltage. When the next word line in the program progress direction is the normal word line, the flash memory device 1100 may perform main sensing on the selected word line WLs and may then perform the data recover read operation for compensating for threshold voltages of the selected word line WLs based on a result of performing sensing on the next word line.

However, when the next word line is the dummy word line or is the unprogrammed word line, the flash memory device 1100 may perform main sensing on the selected word line WLs and may then perform the data recover read operation for compensating for threshold voltages of the selected word line WLs based on a result of performing sensing on the previous word line. A voltage that is provided to perform the data recover read operation is referred to as a "data recover read voltage DR".

Figure 12:
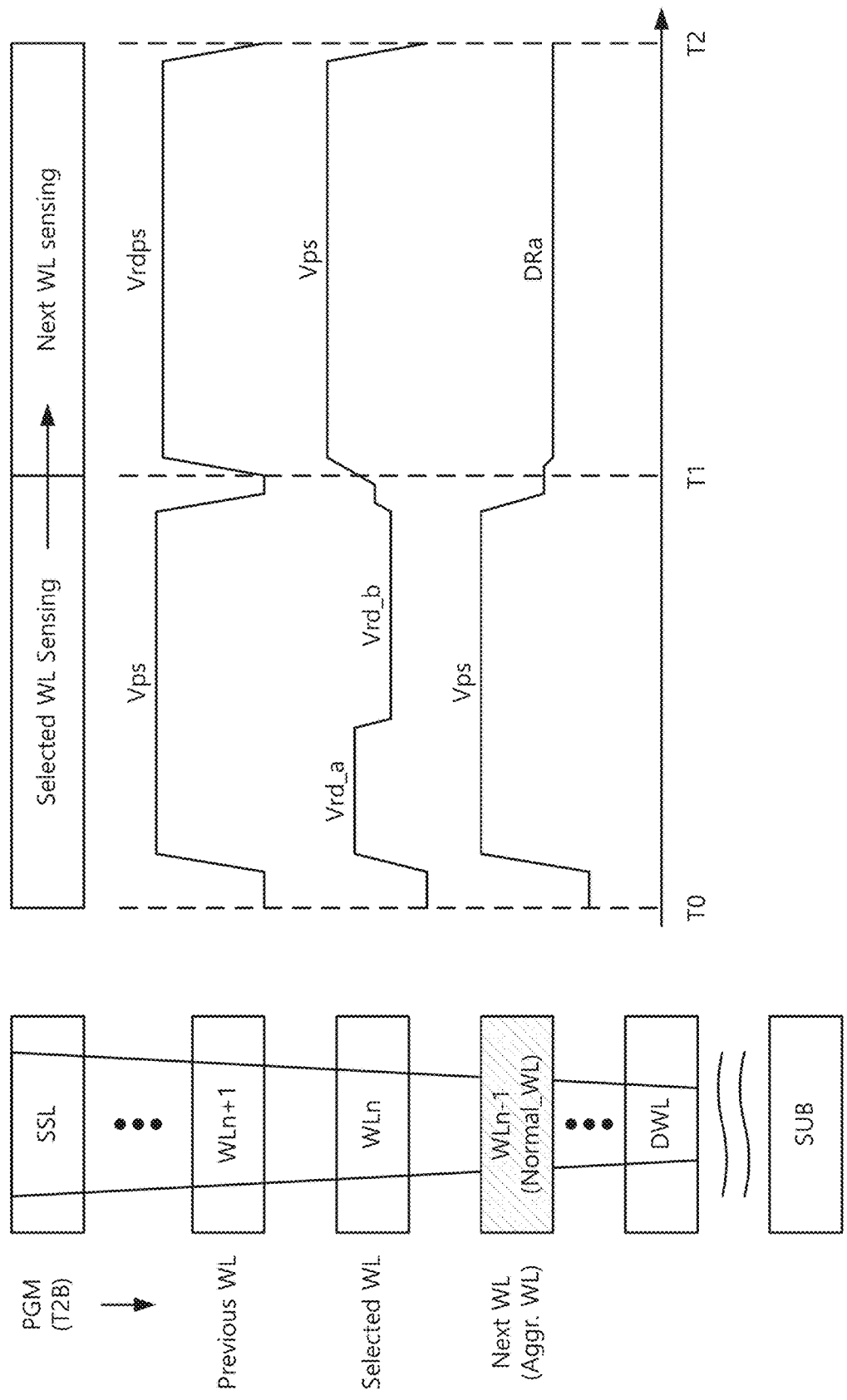
FIGS. 12 and 13 are timing diagrams illustrating a data recover read operation when programming progresses from the string selection line to a substrate.
Figure 13:
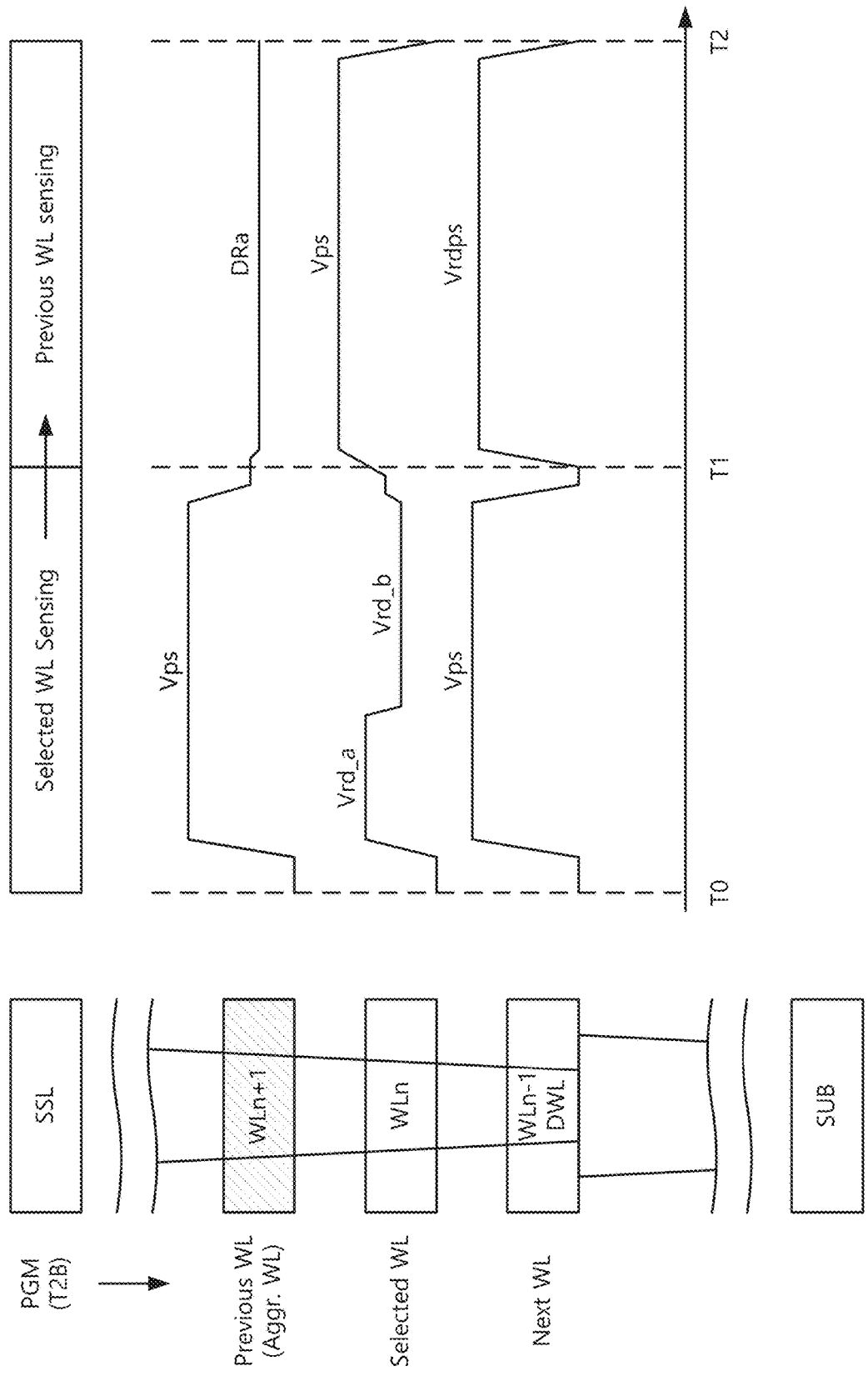

FIGS. 12 and 13 are timing diagrams illustrating a data recover read operation when programming progresses from the string selection line SSL to a substrate SUB. A manner in which programming progresses from the top to the bottom is called a top to bottom (T2B) program manner FIG. 12 shows an example where the next word line is the normal word line, and FIG. 13 shows an example where the next word line is the dummy word line.

Referring to FIG. 12, the (n+1)-th word line WLn+1 is the previous word line, the n-th word line WLn is the selected word line, and the (n−1)-th word line WLn−1 is the next word line. The flash memory device 1100 (refer to FIG. 6) may perform the sensing operation on the n-th word line.

During the selected word line sensing operation, a first read voltage Vrd_a and a second read voltage Vrd_b may be provided to the n-th word line. The pass voltage Vps may be provided to adjacent word lines WLn+1 and WLn−1. After the selected word line sensing operation, an additional sensing operation may be performed to compensate for threshold voltages of the selected word line.

After the selected word line sensing operation, the flash memory device 1100 may detect a current disturbance level of the selected word line through one additional sensing operation and may compensate for the disturbance based on a detection result. In this case, a word line targeted for the one additional sensing operation is the aggressor word line and is the (n−1)-th word line WLn−1 physically. A data recover read voltage DRa for determining the compensation level may be provided to the (n−1)-th word line WLn−1. In this case, the read pass voltage Vrdps may be applied to the (n+1)-th word line WLn+1, and the pass voltage Vps may be applied to the n-th word line WLn.

When a program manner of the flash memory device 1100 is the T2B program manner and the next word line is the normal word line, the flash memory device 1100 performs the selected word line sensing operation and then performs the additional sensing operation (i.e., next word line sensing operation) by providing the data recover read voltage DRa to the next word line WLn−1. The flash memory device 1100 may apply a result of the additional sensing operation to a sensing result of the n-th word line WLn such that threshold voltages of the selected word line that are disturbed by the interference to be caused in the program operation for the next word line WLn−1 are compensated for.

Referring to FIG. 13, the (n+1)-th word line WLn+1 is the previous word line, the n-th word line WLn is the selected word line, and the (n−1)-th word line WLn−1 is the next word line. In the example of FIG. 13, the next word line is the dummy word line DWL.

After the selected word line sensing operation, an additional sensing operation may be performed to compensate for threshold voltages of the selected word line. In this case, a word line targeted for one additional sensing operation is the aggressor word line. When the next word line is the dummy word line, the aggressor word line is the previous word line and is the (n+1)-th word line WLn+1 physically.

The data recover read voltage DRa for determining the compensation level may be provided to the (n+1)-th word line WLn+1. In this case, the read pass voltage Vrdps may be applied to the (n−1)-th word line WLn−1, and the pass voltage Vps may be applied to the n-th word line WLn. When a program manner of the flash memory device 1100 is the T2B program manner and the next word line is the dummy word line, the flash memory device 1100 performs the selected word line sensing operation and then performs the additional sensing operation (i.e., previous word line sensing operation) by providing the data recover read voltage DRa to the previous word line WLn+1. The flash memory device 1100 may apply a result of the additional sensing operation to a sensing result of the n-th word line WLn. The flash memory device 1100 may compensate for disturbed threshold voltages of the selected word line by applying the result of the additional sensing operation to the sensing result of the n-th word line WLn. Herein, the threshold voltages of the selected word line may be disturbed by lateral spreading that is caused when programming is performed on the previous word line WLn+1.

Figure 14:
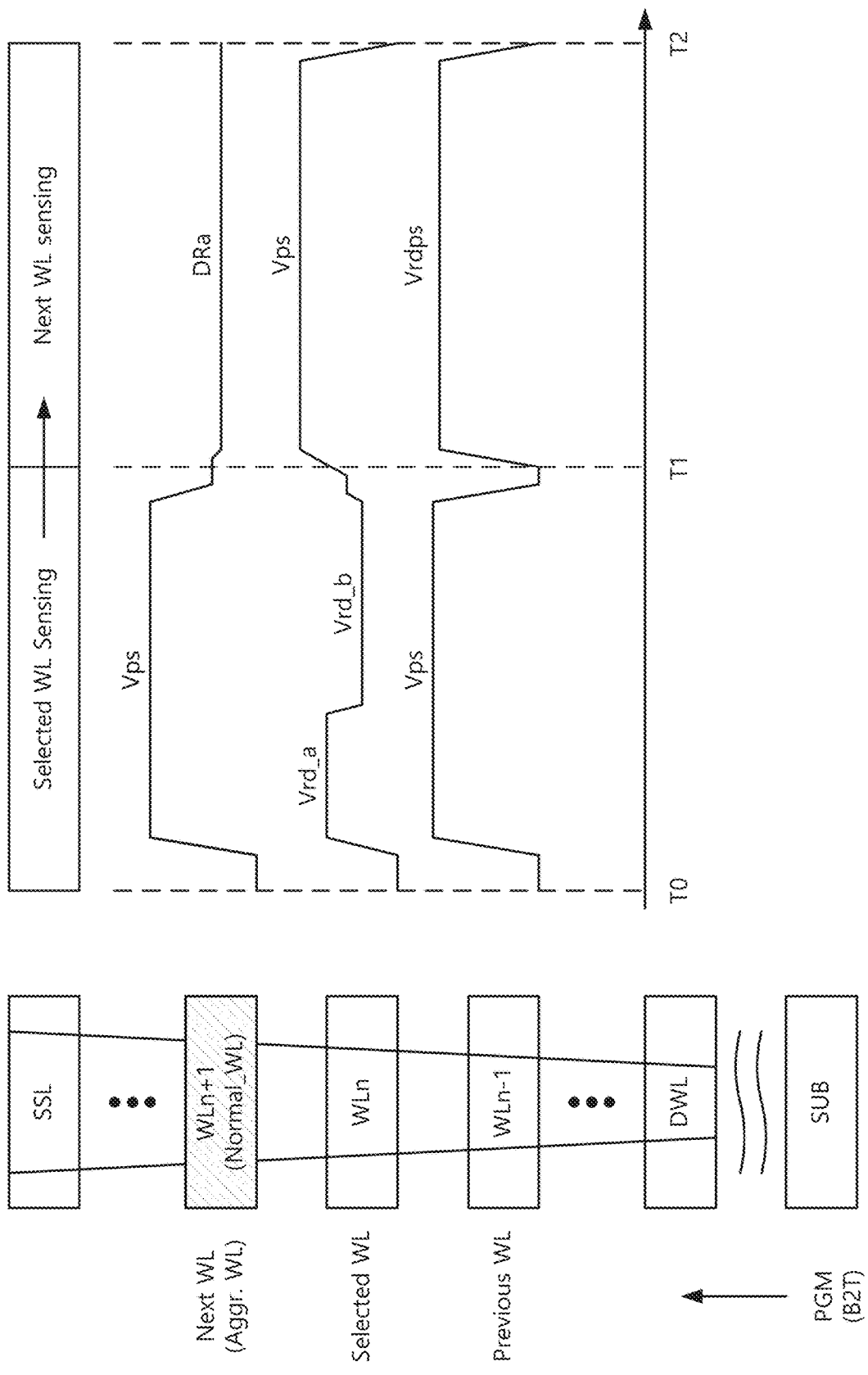
FIGS. 14 and 15 are timing diagrams illustrating a data recover read operation when programming progresses from the substrate to the string selection line.
Figure 15:
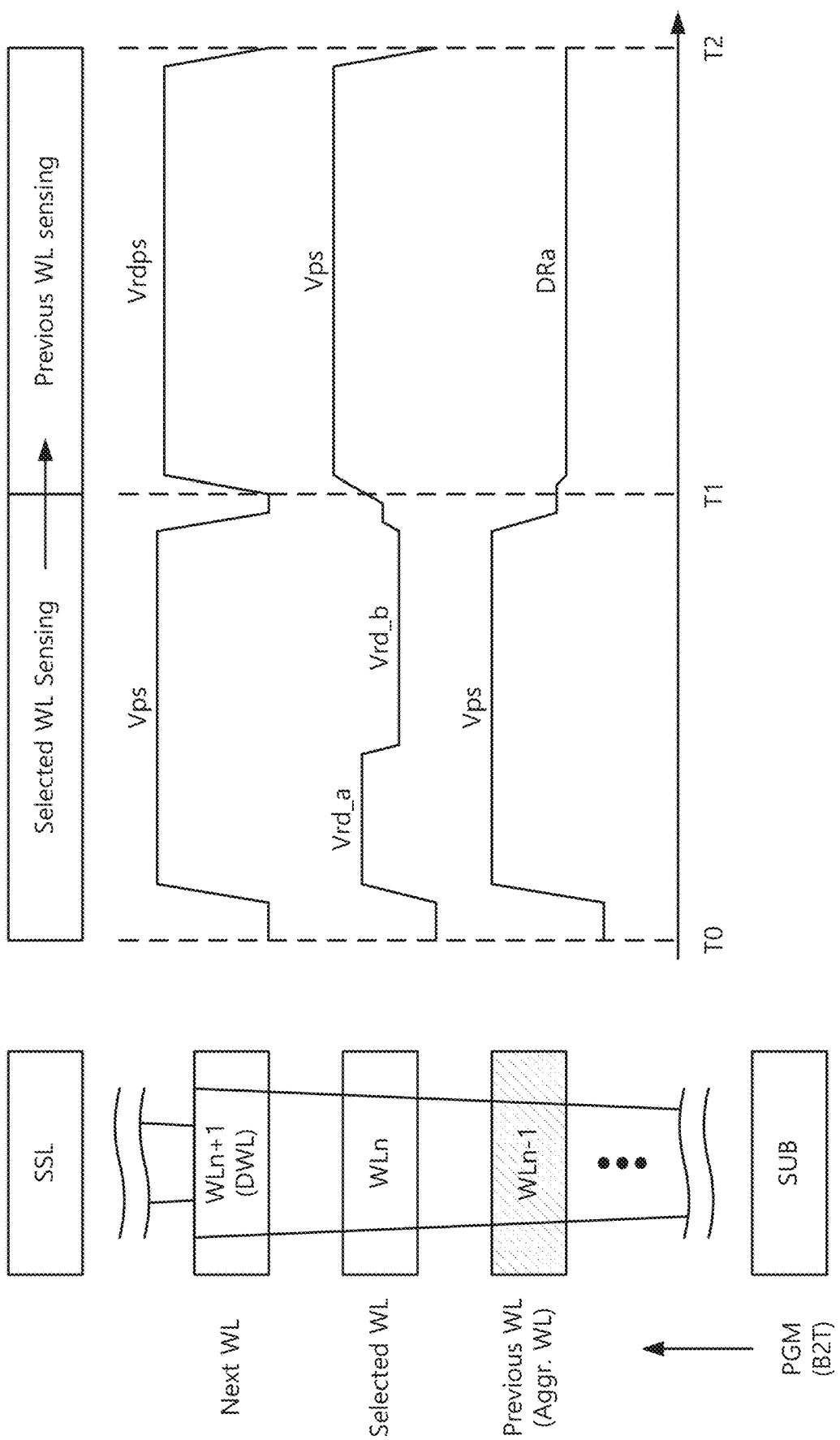

FIGS. 14 and 15 are timing diagrams illustrating a data recover read operation when programming progresses from the substrate SUB to the string selection line SSL. A manner in which programming progresses from the bottom to the top is called a bottom to top (B2T) program manner FIG. 14 shows an example where the next word line is the normal word line, and FIG. 15 shows an example where the next word line is the dummy word line.

Referring to FIG. 14, the (n−1)-th word line WLn−1 is the previous word line, the n-th word line WLn is the selected word line, and the (n+1)-th word line WLn+1 is the next word line. After the selected word line sensing operation, an additional sensing operation may be performed to compensate for threshold voltages of the selected word line. In this case, a word line targeted for one additional sensing operation is the aggressor word line. When the next word line is the normal word line, the aggressor word line is the next word line and is the (n+1)-th word line WLn+1 physically.

The data recover read voltage DRa for determining the compensation level may be provided to the (n+1)-th word line WLn+1. In this case, the read pass voltage Vrdps may be applied to the (n−1)-th word line WLn−1, and the pass voltage Vps may be applied to the n-th word line WLn. When the next word line is the normal word line, the flash memory device 1100 performs the selected word line sensing operation and then performs the additional sensing operation (i.e., next word line sensing operation) by providing the data recover read voltage DRa to the next word line WLn+1. The flash memory device 1100 may apply a result of the additional sensing operation to a sensing result of the n-th word line WLn such that threshold voltages of the selected word line that are disturbed by the interference to be caused in the program operation for the next word line WLn+1 are compensated for.

Referring to FIG. 15, because the next word line is the dummy word line, the aggressor word line is the previous word line and is the (n−1)-th word line WLn−1 physically. The data recover read voltage DRa for determining the compensation level may be provided to the (n−1)-th word line WLn−1. In this case, the read pass voltage Vrdps may be applied to the (n+1)-th word line WLn+1, and the pass voltage Vps may be applied to the n-th word line WLn.

When the next word line is the dummy word line, the flash memory device 1100 performs the selected word line sensing operation and then performs the additional sensing operation (i.e., previous word line sensing operation) by providing the data recover read voltage DRa to the previous word line WLn−1. The flash memory device 1100 may compensate for disturbed threshold voltages of the selected word line by applying the result of the additional sensing operation to the sensing result of the n-th word line WLn. Herein, the threshold voltages of the selected word line may be disturbed by lateral spreading that is caused when programming is performed on the previous word line WLn−1.

Figure 16:
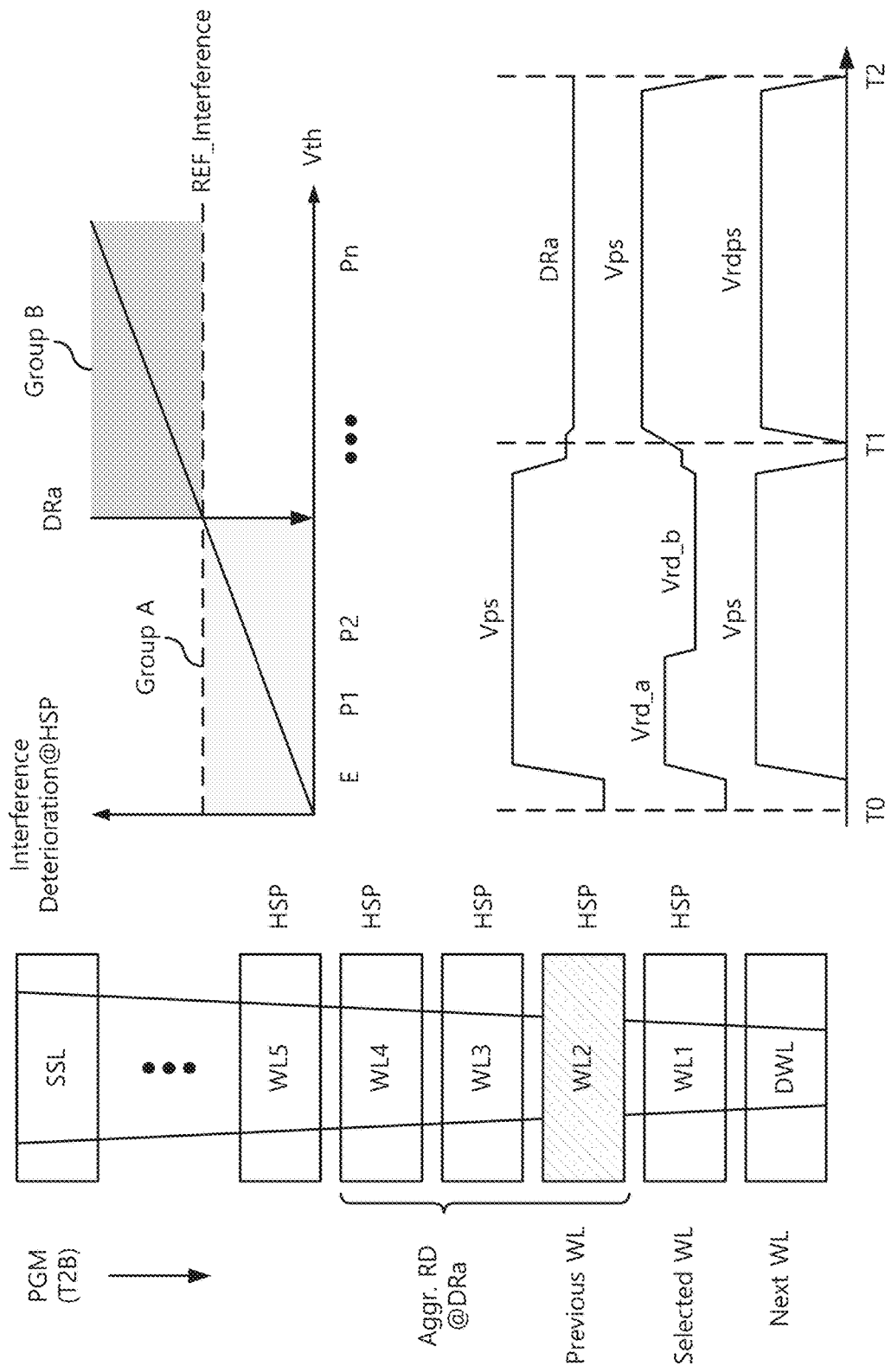
FIGS. 16 and 17 are diagrams illustrating a data recover read operation when programming is performed on an aggressor word line in a high-speed program manner or a multi-step program manner.
Figure 17:
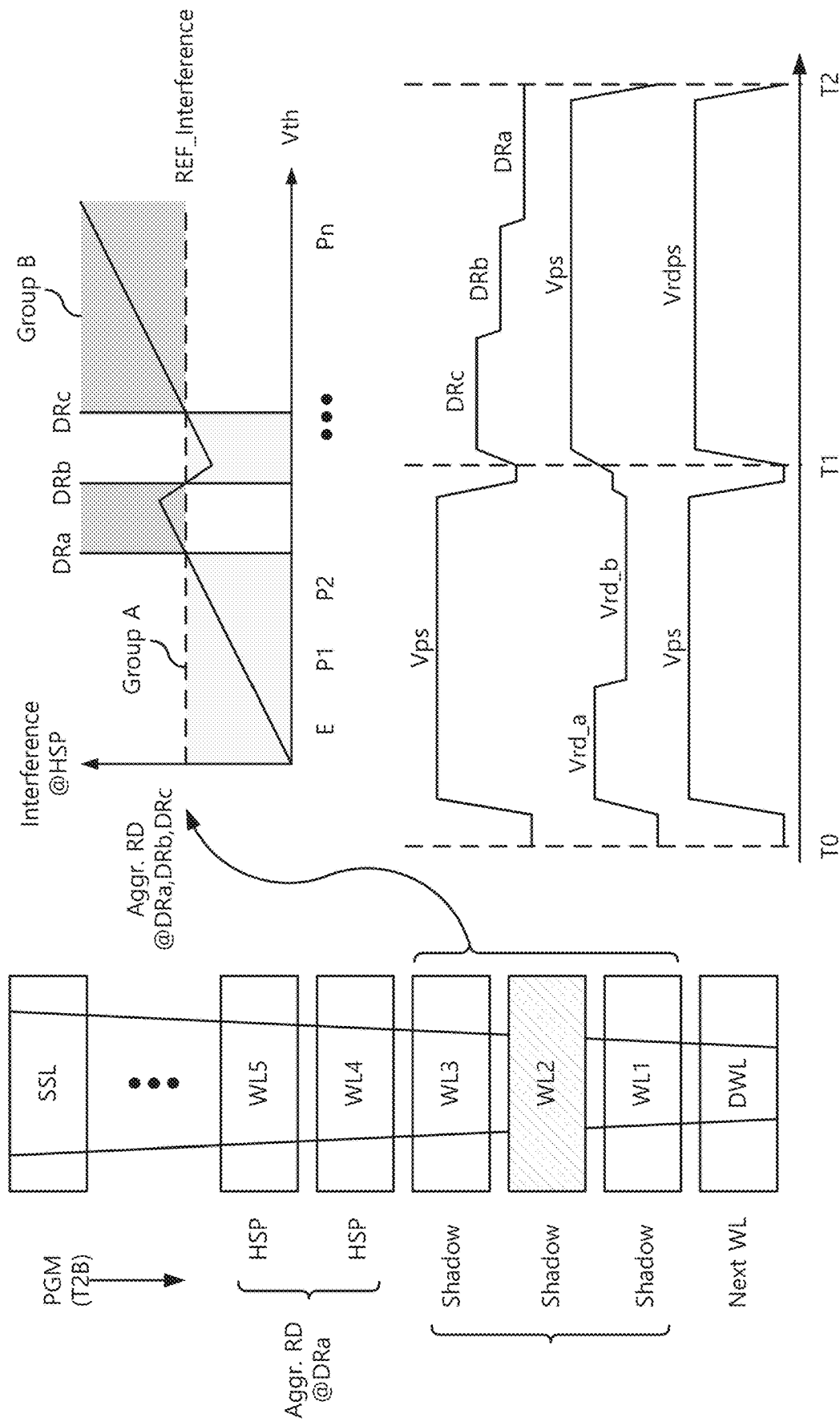

FIGS. 16 and 17 are diagrams illustrating a data recover read operation when programming is performed on an aggressor word line in a high-speed program (HSP) manner or a multi-step program manner. The influence of disturbance may vary depending on the program manner A compensation method may vary depending on the influence of disturbance. Examples of the T2B program manner are illustrated in FIGS. 16 and 17, but the same principle as the T2B program manner may be applied to the B2T program manner.

When the next word line in the program progress direction is the dummy word line, the flash memory device 1100 may differently select a word line for determining compensation, that is, the aggressor word line. Threshold voltages of the aggressor word line may be classified into threshold voltage groups for determining compensation depending on a program manner of a corresponding word line, and threshold voltage compensation may be differently made for each threshold voltage group.

Referring to FIG. 16, the second word line WL2 is the previous word line and the first word line WL1 is the selected word line. The next word line is the dummy word line DWL. When the next word line is the dummy word line DWL, the aggressor word line is the previous word line and is the second word line WL2 physically.

When the next word line is the dummy word line DWL, there is no deterioration due to the interference; in this case, the flash memory device 1100 fails to perform compensation through the data recover read operation. Accordingly, the flash memory device 1100 of the present disclosure may select the previous word line WL1 as the aggressor word line and may compensate for disturbance due to the lateral spreading.

The data recover read voltage DRa for determining the compensation level may be provided to the second word line WL2. In this case, the read pass voltage Vrdps may be applied to the dummy word line DWL, and the pass voltage Vps may be applied to the first word line WL1. When a program manner of the flash memory device 1100 is the T2B program manner and the next word line is the dummy word line, the flash memory device 1100 performs the selected word line sensing operation and then performs the additional sensing operation by providing the data recover read voltage DRa to the previous word line WL2. The flash memory device 1100 may compensate for disturbed threshold voltages by applying a result of the additional sensing operation to a sensing result of the first word line WL1.

However, because programming has been performed on the previous word line WL2 being the aggressor word line in the HSP manner, the degree of deterioration due to the interference according to threshold voltages of the aggressor word line may increase in proportion to the program manner FIG. 16 shows an example where two threshold voltage groups are determined based on the degree of deterioration due to the interference according to threshold voltages of the aggressor word line and compensation is made in different directions. The data recover read voltage DRa is applied based on a deterioration level REF_Interference due to the interference according to threshold voltages of the aggressor word line. Threshold voltages of the aggressor word line may be classified into Group A where threshold voltages of the aggressor word line are smaller than the data recover read voltage DRa, and Group B where threshold voltages of the aggressor word line are greater than the data recover read voltage DRa. Threshold voltages may be compensated for by applying the degree of deterioration due to the interference to a result of the selected word line sensing operation.

Referring to FIG. 17, the flash memory device 1100 may use the multi-step program manner such as a shadow program manner for the purpose of improving threshold voltage distributions of a word line (e.g., WL1) adjacent to the dummy word line DWL. The flash memory device 1100 may also apply the multi-step program manner to word lines (e.g., WL2 and WL3) at which distribution deterioration is seriously caused, in addition to the adjacent word line WL1.

FIG. 17 shows an example where the shadow program manner for improving threshold voltage distributions is applied to the first to third word lines WL1 to WL3 and the HSP manner is applied to the remaining word lines.

Because the next word line WL4 of the fifth word line WL5 is the normal word line, the fourth word line WL4 is the aggressor word line. Accordingly, the flash memory device 1100 may perform threshold voltage distribution compensation on the fifth word line WL5 based on a sensing result (e.g., threshold voltage information) of the fourth word line WL4. In this case, because the fourth word line WL4 is a word line where programming is performed in the HSP manner, only one sensing operation may be performed based on the degree of deterioration due to specific interference, for example, the data recover read voltage DRa, and compensation may be performed based on a result of the sensing operation.

Because the next word line of the third word line WL3 is the normal word line being the second word line WL2, the second word line is the aggressor word line. Accordingly, the flash memory device 1100 may compensate for a sensing result of the third word line WL3 based on a result of performing sensing on the second word line WL2, that is, threshold voltage information of the second word line WL2. In this case, because the second word line WL2 is a word line where programming is performed in the shadow program manner, threshold voltage groups may be differently set based on the degree of deterioration due to specific interference.

The flash memory device 1100 according to an embodiment of the present disclosure may determine whether the first word line WL1 on which programming is performed after the second word line WL2 is the dummy word line. Threshold voltage compensation may be performed on the second word line WL2 based on a result of the data recover read operation of the first word line WL1 or the third word line WL3, depending on a determination result.

When it is determined that the first word line is the dummy word line, the flash memory device 1100 may perform threshold voltage compensation on the second word line WL2, based on the result of the data recover read operation of the third word line WL3. In this case, the flash memory device 1100 may determine whether a program manner associated with the third word line WL3 is the high-speed program manner or the multi-step program manner and may perform threshold voltage compensation with respect to a threshold voltage group depending on a determination result.

When it is determined that the first word line WL1 is not the dummy word line, the flash memory device 1100 may perform threshold voltage compensation on the second word line WL2, based on the result of the data recover read operation of the first word line WL1. In this case, the flash memory device 1100 may determine whether a program manner associated with the first word line WL1 is the high-speed program manner or the multi-step program manner and may perform threshold voltage compensation with respect to a threshold voltage group depending on a determination result. In the case where the shadow program manner is applied, threshold voltage compensation may be performed based on results of performing sensing by using three data recover read voltages DRa, DRb, and DRc.

In the case where the shadow program manner is applied, the degree of deterioration due to the interference may not increase in proportion to the shadow program manner FIG. 17 shows an example where two threshold voltage groups are determined based on the degree of deterioration due to the interference according to threshold voltages of the aggressor word line and compensation is made in different directions. The data recover read voltages DRa, DRb, and DRc are applied based on a deterioration level REF_Interference due to the interference according to threshold voltages of the aggressor word line such that threshold voltages of the aggressor word line are classified into two groups.

The threshold voltages of the aggressor word line may be classified into Group A where threshold voltages of the aggressor word line are smaller than the data recover read voltage DRa or are greater than the data recover read voltage DRb and are smaller than the data recover read voltage DRc and Group B where threshold voltages of the aggressor word line are greater than the data recover read voltage DRa and are smaller than the data recover read voltage DRb or are greater than the data recover read voltage DRc. Threshold voltages may be compensated for by applying the degree of deterioration due to the interference to a result of the selected word line sensing operation.

FIG. 18 is a flowchart illustrating a data recover read method of a flash memory device according to an embodiment of the present disclosure. Below, a data recover read method of a flash memory device illustrated in FIG. 6 will be sequentially described.

In operation S110, the flash memory device 1100 determines whether a program manner is the T2B program manner. The reason is that an aggressor word line is differently selected depending on a program progress direction.

When it is determined that the program manner is the T2B program manner, in operation S120, programming may be performed on the (n−1)-th word line WLn−1 after the n-th word line WLn. When the (n−1)-th word line WLn−1 is the normal word line, the (n−1)-th word line WLn−1 may be an aggressor word line Aggr.1. When the (n−1)-th word line WLn−1 is the dummy word line, the (n+1)-th word line WLn+1 may be an aggressor word line Aggr.2.

When it is determined that the program manner is the B2T program manner, in operation S125, programming may be performed on the (n+1)-th word line WLn+1 after the n-th word line WLn. When the (n+1)-th word line WLn+1 is the normal word line, the (n+1)-th word line WLn+1 may be an aggressor word line Aggr.1. When the (n+1)-th word line WLn+1 is the dummy word line, the (n−1)-th word line WLn−1 may be an aggressor word line Aggr.2.

In operation S130, whether the aggressor word line Aggr.1 is the dummy word line is determined. Herein, the flash memory device 1100 may determine whether the aggressor word line Aggr.1 is a word line on which programming is not yet performed.

When it is determined that the aggressor word line Aggr.1 is the dummy word line DWL (Yes), in operation S140, the previous word line may be the aggressor word line Aggr.2. The flash memory device 1100 may determine whether a program manner in which programming is performed on the previous word line is the HSP manner or the multi-step program manner.

When it is determined that the program manner associated with the previous word line is the HSP manner, in operation S141, the flash memory device 1100 may compensate for threshold voltage distributions of the selected word line based on a sensing result of the previous word line. When it is determined that the program manner associated with the previous word line is the multi-step program manner, in operation S142, the flash memory device 1100 may compensate for threshold voltage distributions of the selected word line with respect to a threshold voltage group different from that of the HSP manner, based on a sensing result of the previous word line.

When it is determined that the aggressor word line Aggr.1 is not the dummy word line DWL (No), in operation S150, the next word line may be the aggressor word line Aggr.1. The flash memory device 1100 may determine whether a program manner in which programming is performed on the next word line is the HSP manner or the multi-step program manner.

When it is determined that the program manner associated with the next word line is the HSP manner, in operation S151, the flash memory device 1100 may compensate for threshold voltage distributions of the selected word line based on a sensing result of the next word line. When it is determined that the program manner associated with the next word line is the multi-step program manner, in operation S152, the flash memory device 1100 may compensate for threshold voltage distributions of the selected word line with respect to a threshold voltage group different from that of the HSP manner, based on a sensing result of the next word line.

As illustrated in FIG. 18, the flash memory device 1100 according to an embodiment of the present disclosure may differently select an aggressor word line depending on the program progress direction T2B or B2T. The flash memory device 1100 may differently determine a word line depending on a location of an aggressor word line and whether programming is performed. Also, the flash memory device 1100 may differently select a threshold voltage group depending on a program manner (i.e., an HSP manner or a multi-step program manner) of an aggressor word line.

According to an embodiment of the present disclosure, when a next word line on which programming is performed after a selected word line is a dummy word line, a flash memory device may perform threshold voltage compensation on the selected word line based on a result of performing the data recover read operation on a previous word line on which programming is performed before the selected word line. According to the present disclosure, even in case where the next word line is the dummy word line or is in a state of being not programmed, the threshold voltage compensation may be performed on the selected word line by performing the data recover read operation.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A flash memory device comprising:
   a memory cell array connected with a plurality of word lines including a selected word line, a previous word line on which programming is performed before the selected word line, and a next word line on which programming is performed after the selected word line; and
   control logic configured to:
      perform threshold voltage compensation on the plurality of word lines through a data recover read operation,
      determine that the next word line is a dummy word line,
      in response to determining that the next word line is a dummy word line, set the previous word line as an aggressor word line,
      perform a data recover read operation on the aggressor word line, and
      perform the threshold voltage compensation on the selected word line based on a result of the data recover read operation of the aggressor word line.

2. The flash memory device of claim 1, wherein:
   the plurality of word lines include:
      a first word line;
      a second word line placed on the first word line in a direction perpendicular to a substrate and adjacent to the first word line; and
      a third word line placed on the second word line in the direction perpendicular to the substrate and adjacent to the second word line,
   the first word line is the next word line,
   the second word line is the selected word line, and
   the third word line is the previous word line.

3. The flash memory device of claim 2, wherein when the first word line is the dummy word line, the threshold voltage compensation is performed on the second word line based on a result of the data recover read operation of the third word line.

4. The flash memory device of claim 3, wherein when the first word line is a normal word line, the threshold voltage compensation is performed on the second word line based on a result of the data recover read operation of the first word line.

5. The flash memory device of claim 2, wherein when the first word line is a word line on which programming is not performed, the threshold voltage compensation is performed on the second word line based on a result of the data recover read operation of the third word line.

6. The flash memory device of claim 1, wherein:
   the plurality of word lines include:
      a first word line;
      a second word line placed on the first word line in a direction perpendicular to a substrate and adjacent to the first word line; and
      a third word line placed on the second word line in the direction perpendicular to the substrate and adjacent to the second word line,
   the first word line is the previous word line,
   the second word line is the selected word line, and
   the third word line is the next word line.

7. The flash memory device of claim 6, wherein when the third word line is the dummy word line, the threshold voltage compensation is performed on the second word line based on a result of the data recover read operation of the first word line.

8. The flash memory device of claim 7, wherein when the third word line is a normal word line, the threshold voltage compensation is performed on the second word line based on a result of the data recover read operation of the third word line.

9. The flash memory device of claim 6, wherein when the third word line is a word line on which programming is not performed, the threshold voltage compensation is performed on the second word line based on a result of the data recover read operation of the first word line.

10. The flash memory device of claim 1, wherein:
the memory cell array is implemented in a multi-stack structure, and
the dummy word line is placed at a junction of stacks of the multi-stack structure.

11. A data recover read method of a flash memory device which includes a next word line, a selected word line placed on the next word line in a direction perpendicular to a substrate and adjacent to the next word line, and a previous word line placed on the selected word line in the direction perpendicular to the substrate and adjacent to the selected word line, the method comprising:
determining that the next word line on which programming is performed after the selected word line is a normal word line;
in response to determining that the next word line is a normal word line, set the next word line as an aggressor word line;
performing a data recover read operation on the aggressor word line; and
performing threshold voltage compensation on the selected word line based on a result of the data recover read operation of the aggressor word line.

12. The method of claim 11, further comprising:
determining whether a program manner associated with the previous word line is a high-speed program manner or a multi-step program manner, wherein
the threshold voltage compensation is performed with respect to a threshold voltage group depending on a determination result.

13. The method of claim 11, wherein when it is determined that the next word line is the normal word line, the threshold voltage compensation is performed on the selected word line based on the result of the data recover read operation of the next word line.

14. The method of claim 13, further comprising:
determining whether a program manner associated with the next word line is a high-speed program manner or a multi-step program manner, wherein
the threshold voltage compensation is performed with respect to a threshold voltage group depending on a determination result.

15. A data recover read method of a flash memory device which includes a previous word line, a selected word line placed on the next word line in a direction perpendicular to a substrate and adjacent to the next word line, and a next word line placed on the selected word line in the direction perpendicular to the substrate and adjacent to the selected word line, the method comprising:
determining that the next word line on which programming is performed after the selected word line is a dummy word line;
in response to determining that the next word line is a dummy word line, set the previous word line as an aggressor word line;
performing a data recover read operation on the aggressor word line; and
performing threshold voltage compensation on the selected word line based on a result of a data recover read operation of the aggressor word line.

16. The method of claim 15, wherein when it is determined that the previous word line is the dummy word line, the threshold voltage compensation is performed on the selected word line based on the result of the data recover read operation of the next word line.

17. The method of claim 16, further comprising:
determining whether a program manner associated with the next word line is a high-speed program manner or a multi-step program manner, wherein
the threshold voltage compensation is performed with respect to a threshold voltage group depending on a determination result.

18. The method of claim 16, wherein when it is determined that the previous word line is not the dummy word line, the threshold voltage compensation is performed on the selected word line based on the result of the data recover read operation of the previous word line.

19. The method of claim 18, further comprising:
determining whether a program manner associated with the previous word line is a high-speed program manner or a multi-step program manner, wherein
the threshold voltage compensation is performed with respect to a threshold voltage group depending on a determination result.

* * * * *